United States Patent
Yu et al.

(10) Patent No.: US 11,749,728 B2
(45) Date of Patent: Sep. 5, 2023

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Li-Zhen Yu, New Taipei (TW);
Chia-Hao Chang, Hsinchu (TW);
Cheng-Chi Chuang, New Taipei (TW);
Yu-Ming Lin, Hsinchu (TW);
Chih-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 61 days.

(21) Appl. No.: 17/401,970

(22) Filed: Aug. 13, 2021

(65) Prior Publication Data

US 2021/0376092 A1 Dec. 2, 2021

Related U.S. Application Data

(62) Division of application No. 16/546,799, filed on Aug. 21, 2019, now Pat. No. 11,094,788.

(51) Int. Cl.
*H01L 29/417* (2006.01)
*H01L 29/66* (2006.01)
*H01L 29/40* (2006.01)
*H01L 21/02* (2006.01)
*H01L 21/311* (2006.01)
(Continued)

(52) U.S. Cl.
CPC .... *H01L 29/41725* (2013.01); *H01L 21/0228* (2013.01); *H01L 21/28556* (2013.01); *H01L 21/31111* (2013.01); *H01L 21/76802* (2013.01); *H01L 21/76877* (2013.01); *H01L 27/0886* (2013.01); *H01L 27/0924* (2013.01); *H01L 29/401* (2013.01); *H01L 29/66545* (2013.01); *H01L 21/31144* (2013.01); *H01L 21/32137* (2013.01); *H01L 21/823418* (2013.01); *H01L 21/823431* (2013.01); *H01L 21/823437* (2013.01); *H01L 21/823468* (2013.01)

(58) Field of Classification Search
CPC ......... H01L 29/41725; H01L 29/66545; H01L 27/0886; H01L 27/0924
See application file for complete search history.

(56) References Cited

U.S. PATENT DOCUMENTS 9,105,490 B2 8/2015 Wang et al.
9,236,267 B2 1/2016 De et al.
(Continued)

*Primary Examiner* — Feifei Yeung Lopez
(74) *Attorney, Agent, or Firm* — Maschoff Brennan

(57) ABSTRACT

A method includes forming a dummy gate structure over a substrate; forming a source/drain structure over the substrate; replacing the dummy gate structure with a metal gate structure; forming a protection cap over the metal gate structure; forming a source/drain contact over the source/drain structure; performing a selective deposition process to form a first etch stop layer on the protection cap, in which the selective deposition process has a faster deposition rate on the protection cap than on the source/drain contact; depositing a second etch stop layer over the first etch stop layer the source/drain contact; etching the second etch stop layer to form an opening; and forming a via contact in the opening.

20 Claims, 29 Drawing Sheets

(51) Int. Cl.
*H01L 21/768* (2006.01)
*H01L 21/285* (2006.01)
*H01L 27/088* (2006.01)
*H01L 27/092* (2006.01)
*H01L 21/3213* (2006.01)
*H01L 21/8234* (2006.01)

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2011/0294292 A1 | 12/2011 | Adetutu et al. |
| 2014/0035010 A1 | 2/2014 | Cai et al. |
| 2015/0194350 A1 | 7/2015 | Cai et al. |
| 2018/0166287 A1 | 6/2018 | Wu et al. |
| 2018/0286959 A1* | 10/2018 | Wang .................. H01L 29/4232 |

* cited by examiner

SEMICONDUCTOR DEVICE AND MANUFACTURING METHOD THEREOF

PRIORITY CLAIM AND CROSS-REFERENCE

This application is a Divisional application of U.S. patent application Ser. No. 16/546,799, filed Aug. 21, 2019, now U.S. Pat. No. 11,094,788, issued on Aug. 17, 2021, which is herein incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
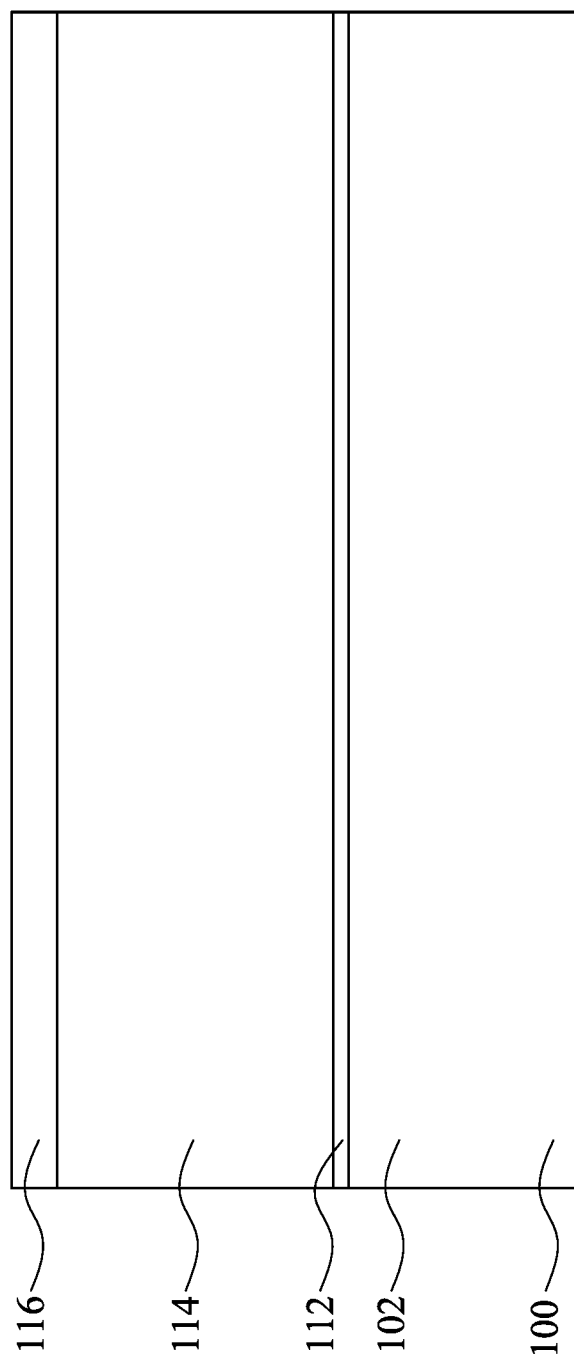
FIGS. 1 to 19 illustrate a method in various stages of fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1 to 19 illustrate a method in various stages of fabricating a semiconductor device in accordance with some embodiments of the present disclosure.

Reference is made to FIG. 1. Shown there is a substrate 100. The substrate 100 includes a fin structure 102. In some embodiments, the fin structure 102 may be formed by, for example, forming a patterned mask layer, which defines the position of the fin structures 102, over the substrate 100, and followed by one or more etching processes to partially remove the substrate 100 to form at least one fin-like structure protruded from the top surface of the substrate 100. In some embodiments, a plurality of isolation dielectric structure as shallow trench isolation (STI) may be formed adjacent to the fin structure.

In some embodiments, the substrate 100 includes silicon. Alternatively, the substrate 100 may include germanium, silicon germanium, gallium arsenide or other appropriate semiconductor materials. Also alternatively, the substrate 100 may include an epitaxial layer. For example, the substrate 100 may have an epitaxial layer overlying a bulk semiconductor. Further, the substrate 100 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 100 may include a semiconductor-on-insulator (SOI) structure. Also alternatively, the substrate 100 may include a buried dielectric layer, such as a buried oxide (BOX) layer, such as that formed by separation by implantation of oxygen (SIMOX) technology, wafer bonding, SEG, or other appropriate method.

A gate dielectric layer 112 is formed over the fin structure 102 of the substrate 100. The gate dielectric layer 112 may be, for example, silicon oxide, silicon nitride, a combination thereof, or the like, and may be deposited or thermally grown according to acceptable techniques. The gate dielectric layer 112 may be formed by suitable process, such as chemical vapor deposition (CVD), physical vapor deposition (PVD), atomic layer deposition (ALD), or any suitable process.

A dummy gate layer 114 is formed over the gate dielectric layer 112. The dummy gate layer 114 may be deposited over the gate dielectric layer 112 and then planarized, such as by a CMP. The dummy gate layer 114 may include polycrystalline-silicon (poly-Si) or poly-crystalline silicon-germanium (poly-SiGe). Further, the dummy gate layer 114 may be doped poly-silicon with uniform or non-uniform doping. The dummy gate layer 114 may be formed by suitable process, such as chemical vapor deposition (CVD), physical vapor deposition (PVD), atomic layer deposition (ALD), or any suitable process.

A mask layer 116 is formed over the dummy gate layer 114. The mask layer 116, which is used as a protection cap layer during the etching process in the following process(es), may include silicon oxide, silicon nitride and/or silicon oxynitride. The mask layer 116 may be formed by suitable process, such as chemical vapor deposition (CVD), physical vapor deposition (PVD), atomic layer deposition (ALD), or any suitable process.

Figure 2:
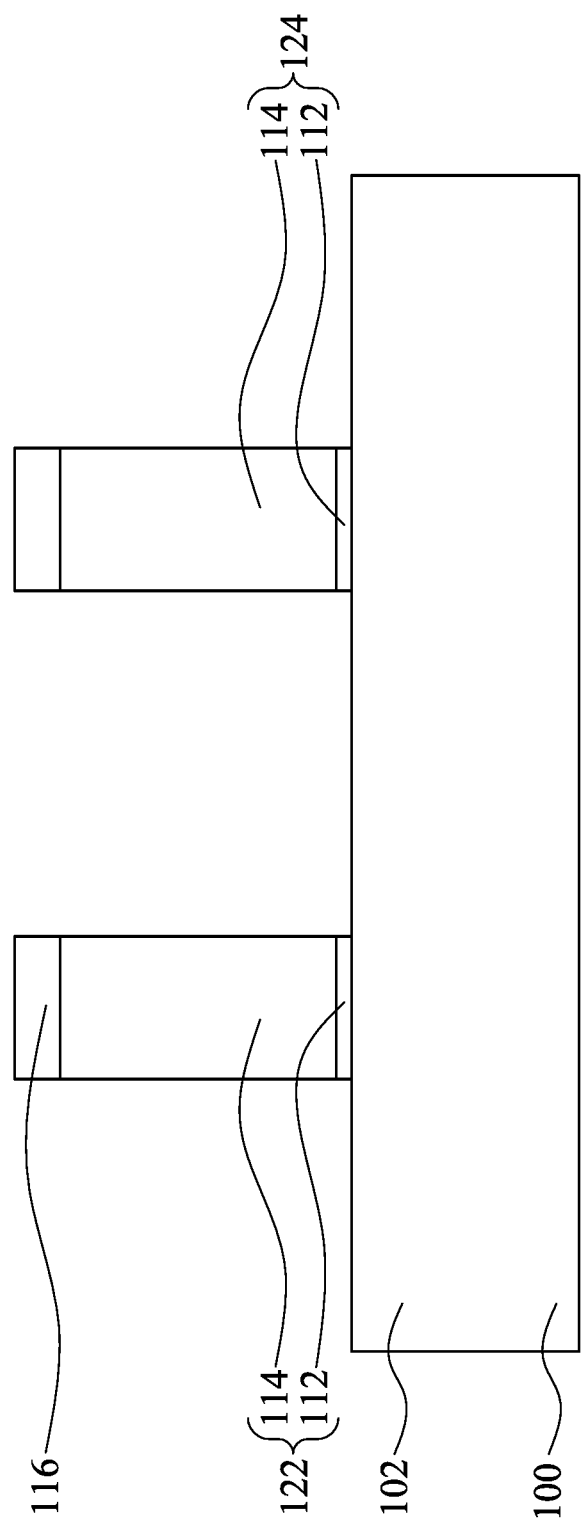

Reference is made to FIG. 2. The gate dielectric layer 112 and the dummy gate layer 114 are patterned to form dummy gate structures 122 and 124. Each of the dummy gate structures 122 and 124 includes the respective remaining portions of the gate dielectric layer 112 and the dummy gate layer 114 after the patterning. In some embodiments, the dummy gate structures 122 and 124 may be formed by, for example, patterning the mask layer 116 using acceptable photolithography and etching techniques, pattern of the patterned mask layer 116 may be transferred to the gate dielectric layer 112 and the dummy gate layer 114, for example, by using an acceptable etching process to etch the gate dielectric layer 112 and the dummy gate layer 114 uncovered by the patterned mask layer 116 to from the dummy gate structures 122 and 124. The dummy gate structures 122 and 124 cover respective channel regions of the fin structure 102. The dummy gate structures 122 and 124 may also have a lengthwise direction substantially perpendicular to the lengthwise direction of the fin structure 102. In some embodiments, the dummy gate structures 122 and 124 are patterned by an anisotropic etching, such as a reactive ion etching (RIE) process.

Figure 3:
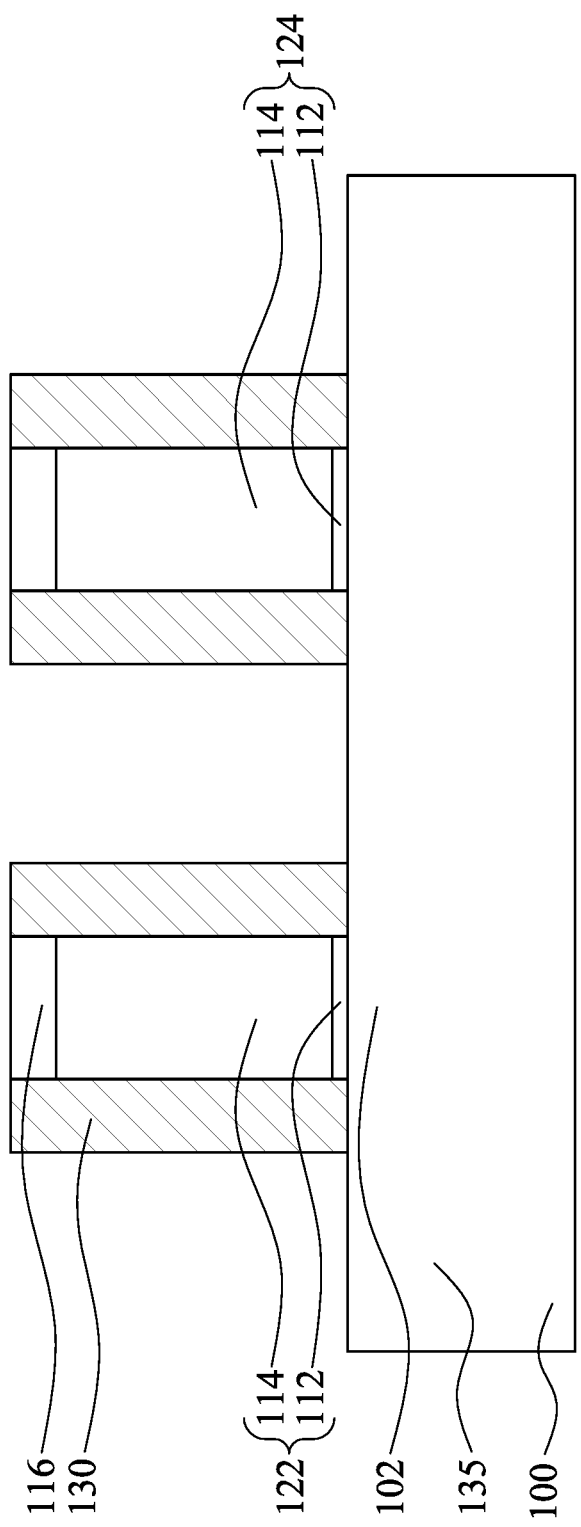

Reference is made to FIG. 3. A plurality of gate spacers 130 are formed on opposite sidewalls of the dummy gate structures 122 and 124, respectively. The gate spacers 130 may be formed by, for example, depositing a spacer layer blanket over the dummy gate structures 122 and 124 and the patterned mask layer 116, and followed by an etching process to remove horizontal portions of the spacer layer, such that vertical portions of the spacer layer remain on sidewalls of the dummy gate structures 122 and 124 and the patterned mask layer 116. In some embodiments, the gate spacers 130 may include $SiO_2$, $Si_3N_4$, $SiO_xN_y$, SiC, SiCN films, SiOC, SiOCN films, and/or combinations thereof. In some other embodiments, the gate spacers 130 may include SiO, HfSi, AlO, ZrSi, AlON, ZrO, HfO, TiO, ZrAlO, ZnO, TaO, LaO, YO, TaCN, ZrN, In some embodiments, each of the gate spacers 130 includes multiple layers, such as main spacer walls, liner layers, and the like. In some embodiments, the gate spacers 130 may be formed by CVD, SACVD, flowable CVD, ALD, PVD, or other suitable process. In some embodiments, the thickness of the gate spacers 130 is in a range of about 1 nm to about 40 nm.

Figure 4:
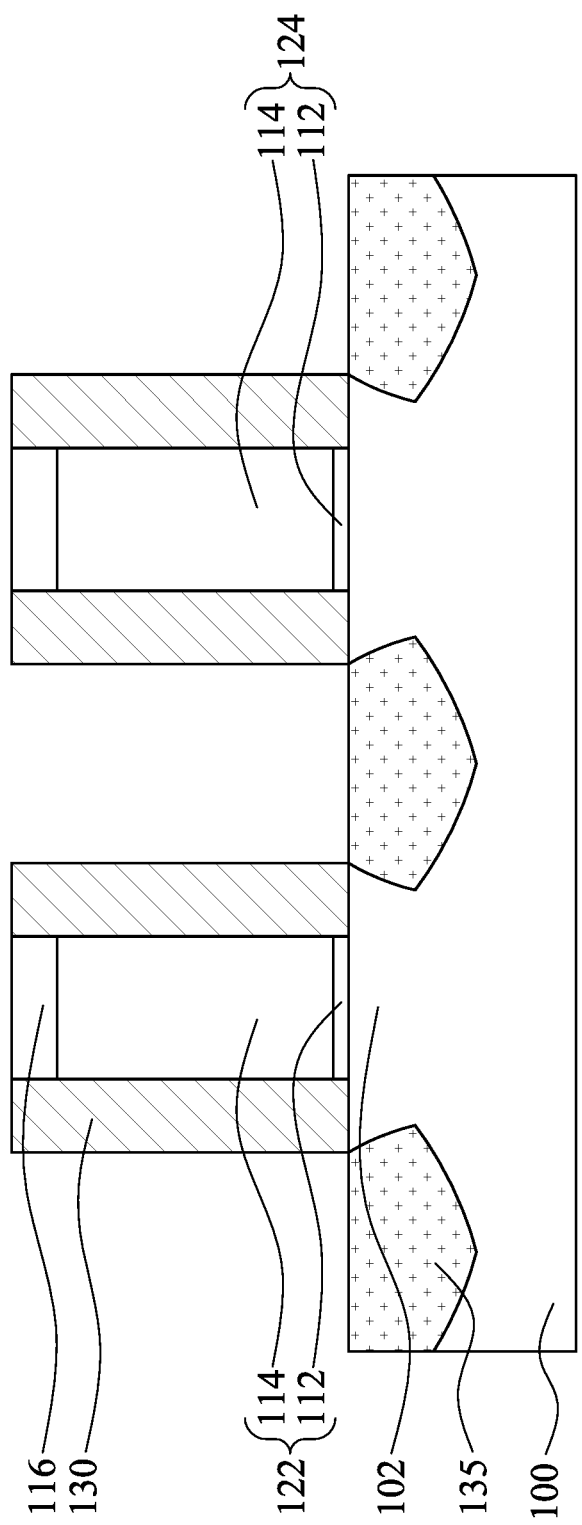

Reference is made to FIG. 4. A plurality of source/drain structures 135 are formed in the fin structure 102. For example, the fin structure 102 exposed by the gate structures 122/124 and the gate spacers 130 is recessed by suitable process, such as etching. Afterwards, a plurality of source/drain structures 135 are formed respectively over the exposed surfaces of the remaining fin structure 102. The source/drain structures 135 may be formed by performing an epitaxial growth process that provides an epitaxy material over the fin structure 102, and thus the source/drain structures 135 can also be interchangeably referred to as epitaxy structures 135 in this context. In various embodiments, the source/drain structures 135 may include Ge, Si, GaAs, AlGaAs, SiGe, GaAsP, SiP, or other suitable material.

Figure 5:
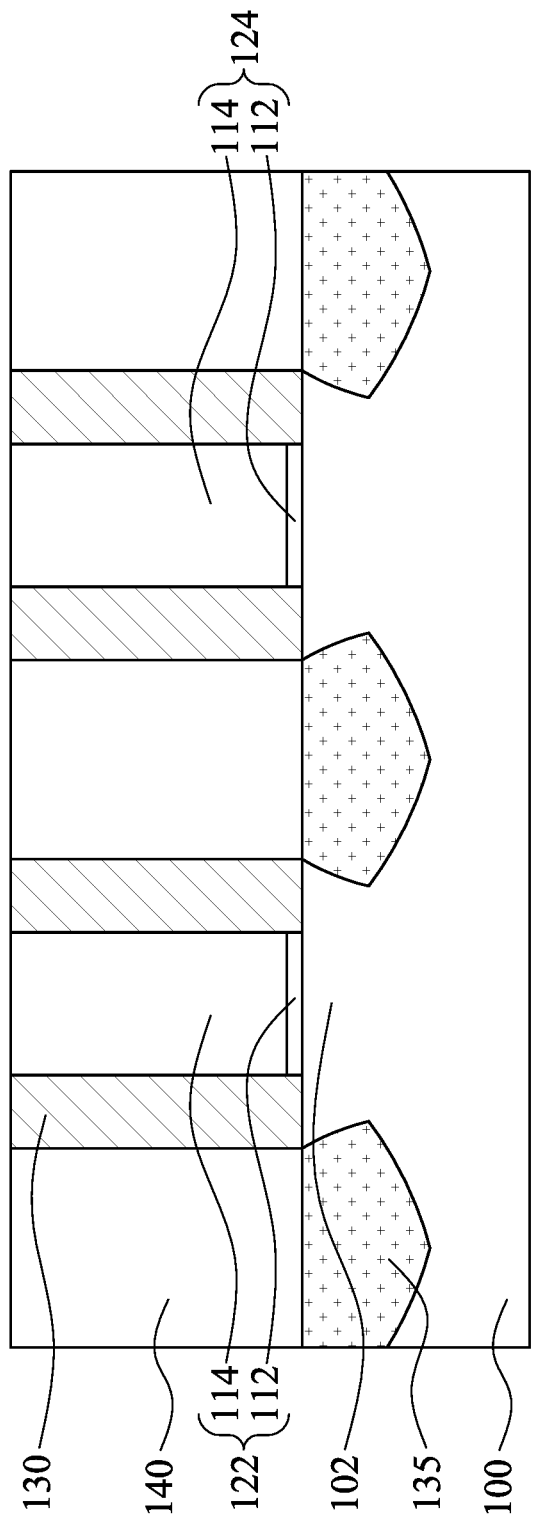

Reference is made to FIG. 5. An interlayer dielectric (ILD) layer 140 is formed adjacent to the gate spacers 130. For example, a dielectric layer is deposited blanket over the substrate 100 and filling the spaces between the gate spacers 130, and followed by a CMP process to remove excessive material of the dielectric layer until the top surfaces of the dummy gate structures 122 and 124 are exposed. In some embodiments, the ILD layer 140 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 140 may be formed using, for example, CVD, ALD, spin-on-glass (SOG) or other suitable techniques.

Figure 6:
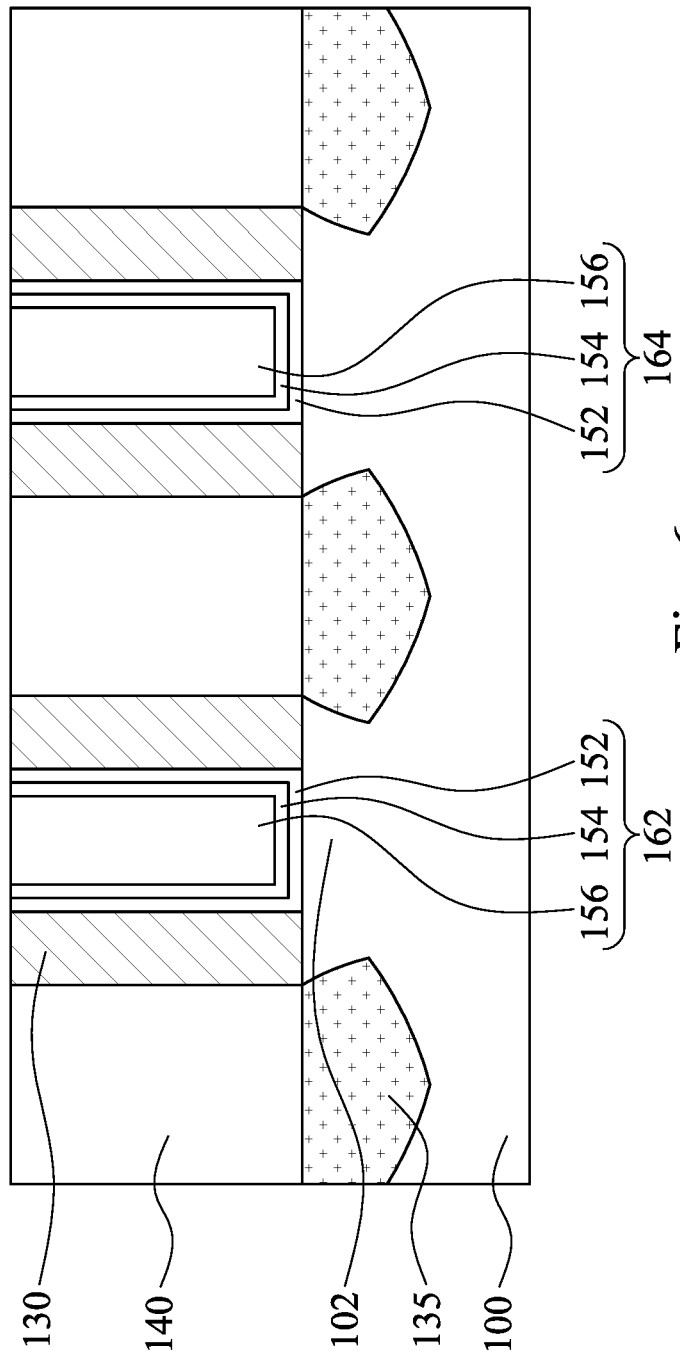

Reference is made to FIG. 6. The dummy gate structures 122 and 124 are replaced with metal gate structures 162 and 164, respectively. In some embodiments, each of the metal gate structures 162 and 164 includes a gate dielectric layer 152, a work function metal layer 154 over the gate dielectric layer 152, and a gate electrode 156 over the work function metal layer 154. In some embodiments, the metal gate structures 162 and 164 may be formed by, for example, removing the dummy gate structures 122 and 124 to respectively form gate trenches between the gate spacers 130, sequentially depositing a gate dielectric material, a work function metal material, and a gate electrode material in the trenches, and followed by a CMP process to remove excessive gate dielectric material, work function metal material, and gate electrode material until the top surface of the ILD layer 140 is exposed to form the metal gate structures 162 and 164.

In some embodiments, the gate dielectric layer 152 may include high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In some embodiments, the work function metal layer 154 may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the gate electrode 156 may include tungsten (W). In some other embodiments, the gate electrode 156 includes aluminum (Al), copper (Cu) or other suitable conductive material.

Figure 7:
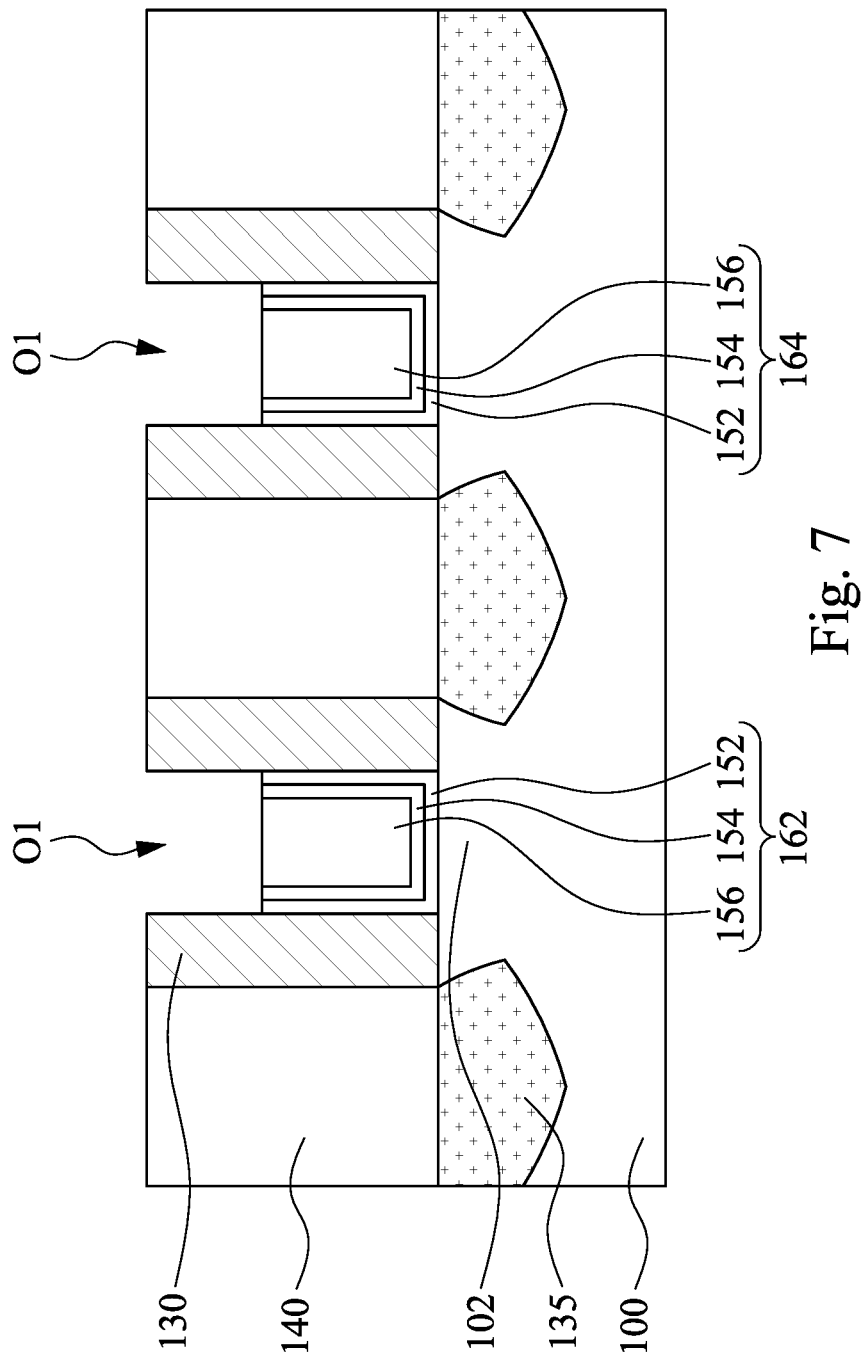

Reference is made to FIG. 7. The metal gate structures 162 and 164 are etched back. In some embodiments, top surfaces of the metal gate structures 162 and 164 are pulled back to a level lower than top surfaces of the gate spacers 130 and the ILD layer 140, so as to form openings O1 respectively over the metal gate structures 162 and 164 and respectively between two adjacent gate spacers 130. In some embodiments, the metal gate structures 162 and 164 may be etched back by suitable etching process, such as wet etching, dry etching, or combination thereof. During etching back the metal gate structures 162 and 164, the etchant is selected to provide etching selectivity between metal gate structures 162 and 164 and other structures, such as the gate spacers 130 and the ILD layer 140. For example, the metal gate structures 162 and 164 has lower etching resistance to the etchant than the gate spacers 130 and the ILD layer 140, such that the metal gate structures 162 and 164 can be etched while keeping the gate spacers 130 and the ILD layer 140 substantially intact.

Figure 8:
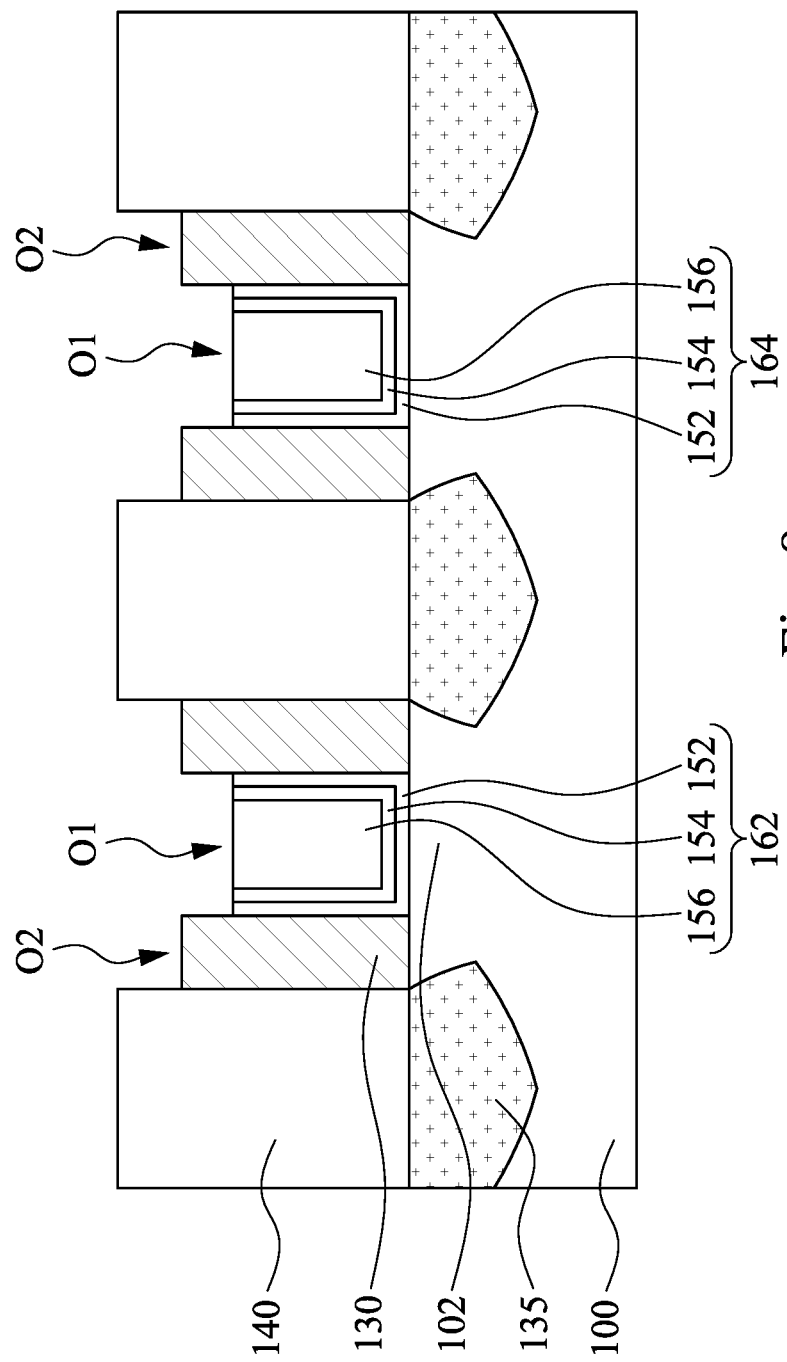

Reference is made to FIG. 8. The gate spacers 130 are etched back. In some embodiments, top surfaces of the gate spacers 130 are pulled back to a level lower than the top surface of the ILD layer 140 but higher than top surfaces of the gate spacers 130, so as to form openings O2 respectively over the gate spacers 130 and the metal gate structures 162 and 164. In some embodiments, the openings O2 is over the openings O1, and the openings O2 is wider than the openings O1. In some embodiments, the gate spacers 130 may be etched back by suitable etching process, such as wet etching, dry etching, or combination thereof. During etching back the gate spacers 130, the etchant is selected to provide etching selectivity between gate spacers 130 and other structures, such as the ILD layer 140 and the metal gate structures 162 and 164. For example, the gate spacers 130 has lower etching resistance to the etchant than the ILD layer 140 and the metal gate structures 162 and 164, such that the gate spacers 130 can be etched while keeping the ILD layer 140 and the metal gate structures 162 and 164 substantially intact. In some embodiments, the etchants of the etching processes described in FIGS. 7 and 8 are different.

Figure 9:
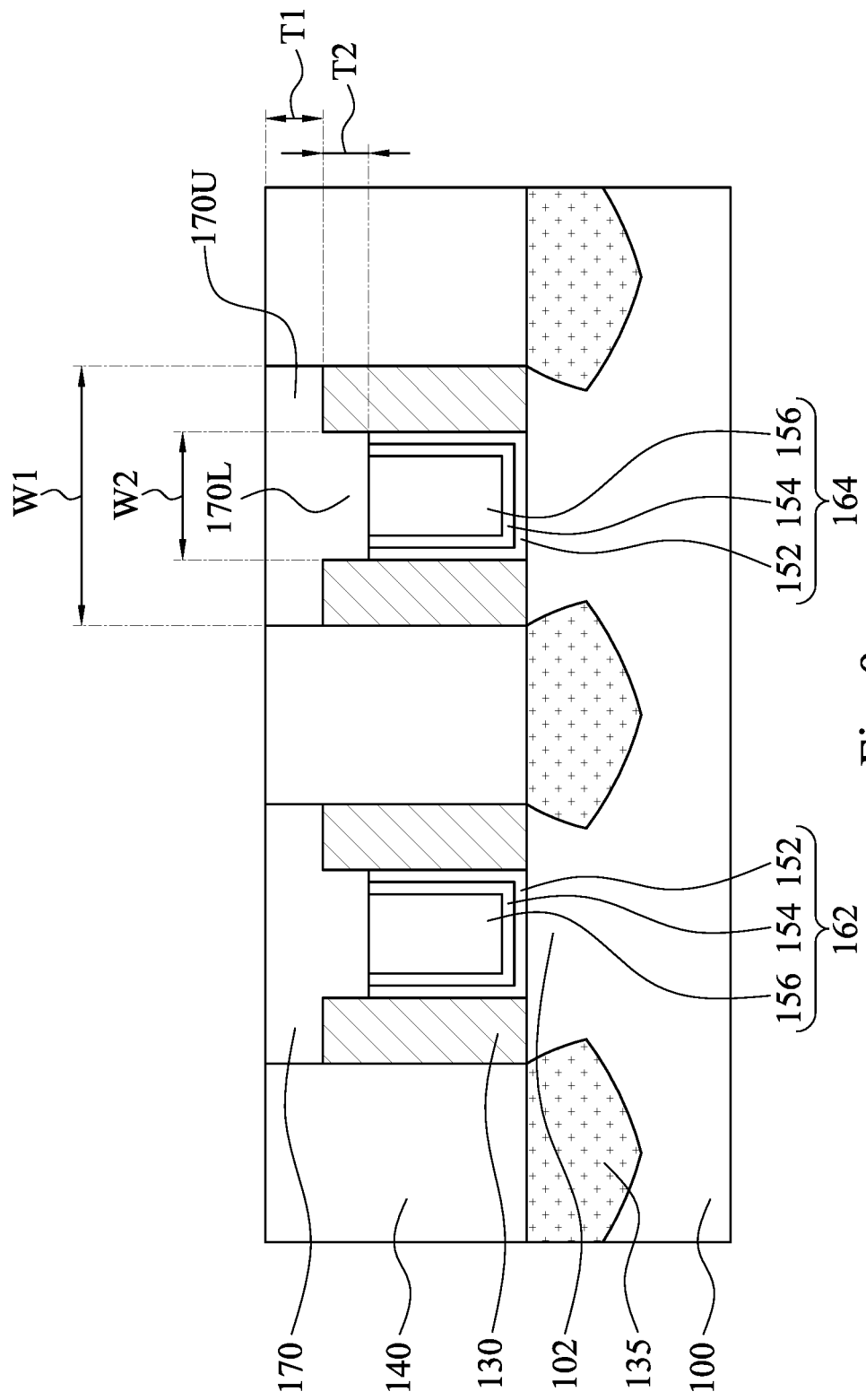

Reference is made to FIG. 9. A plurality of protection caps 170 are formed respectively over the metal gate structures 162 and 164. In some embodiments, the protection caps 170 may be formed by, for example, depositing one or more protection materials blanket over the substrate 100 and filling the openings O1 and O2, and followed by a CMP process to remove excessive protection material until the top surface of the ILD layer 140 is exposed. In greater details, each of the protection caps 170 includes an upper portion 170U and a lower portion 170L, in which the lower portion 170L indicates the portion of the protection caps 170 filling the openings O1, and the upper portion 170U indicates the portion of the protection caps 170 filling the openings O2, respectively. In some embodiments, the upper portion 170U has a width W1 and a thickness T1, in which the width W1 is in a range of about 5 nm to about 30 nm, and the thickness T1 is in a range of about 5 nm to about 50 nm. On the other hand, the lower portion 170L has a width W2 and a thickness T2, in which the width W2 is in a range of about 5 nm to about 30 nm, and the thickness T2 is in a range of about 5 nm to about 50 nm. In some embodiments, the width W1 is greater than the width W2.

In some embodiments, each of the protection caps 170 includes SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or other suitable materials. In some embodiments, the upper and lower portions 170U and 170L of the protection caps 170 may include the same material or different materials. In some embodiments where the upper and lower portions 170U and 170L are made of different materials, there might be a visible interface between the upper and lower portions 170U and 170L.

Figure 10:
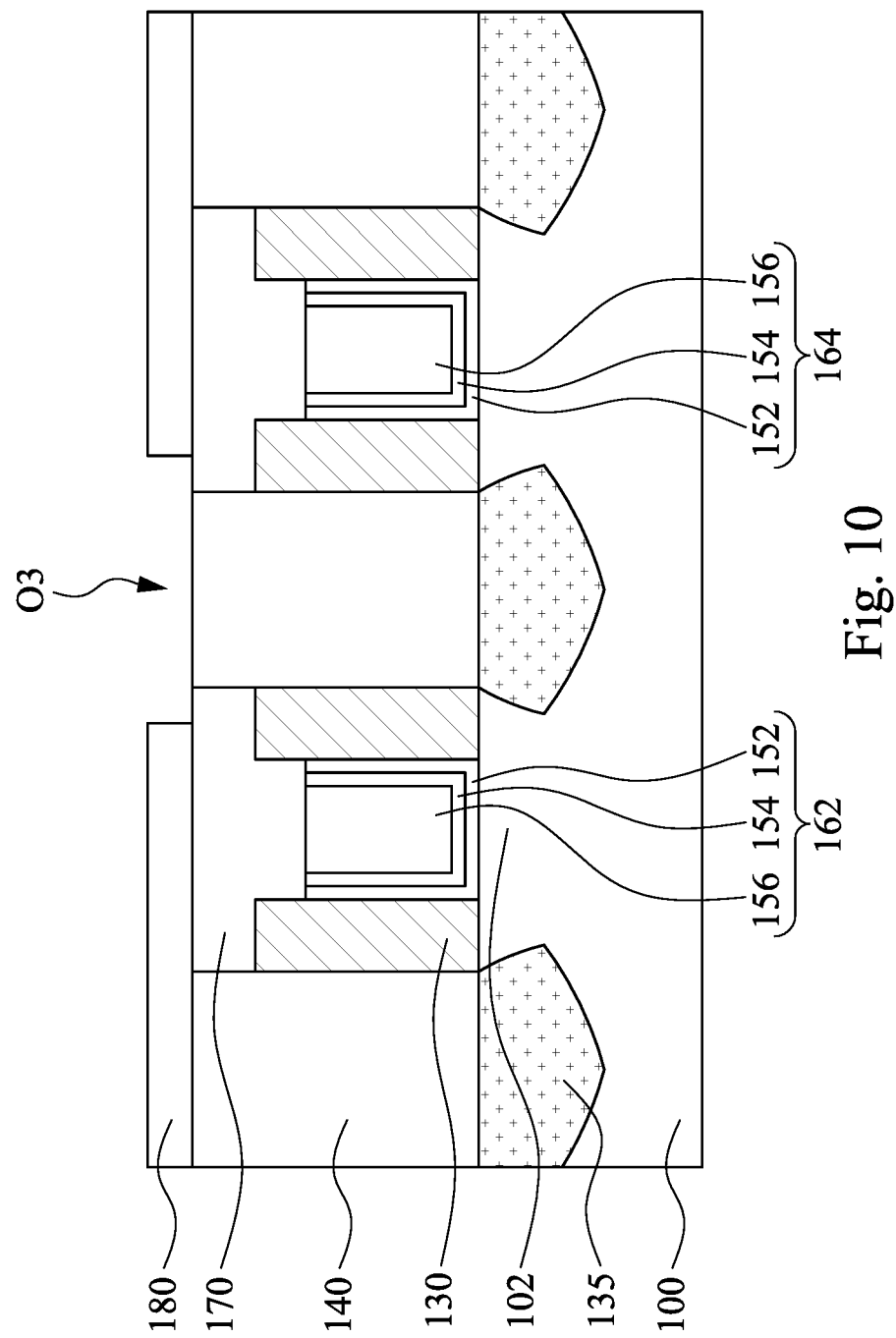

Reference is made to FIG. 10. A patterned mask 180 is formed over the substrate 100 and exposes a portion of the ILD layer 140. In greater detail, the patterned mask 180 has an opening O3 exposing the portion of the ILD layer between the metal gate structures 162 and 164. In some embodiments, the patterned mask 180 includes a photo resist layer. The patterned mask 180 may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer 180 to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer 180 includes a hard mask layer. The hard mask layer includes an oxide material, silicon nitride, silicon oxynitride, an amorphous carbon material, silicon carbide or tetraethylorthosilicate (TEOS).

Figure 11:
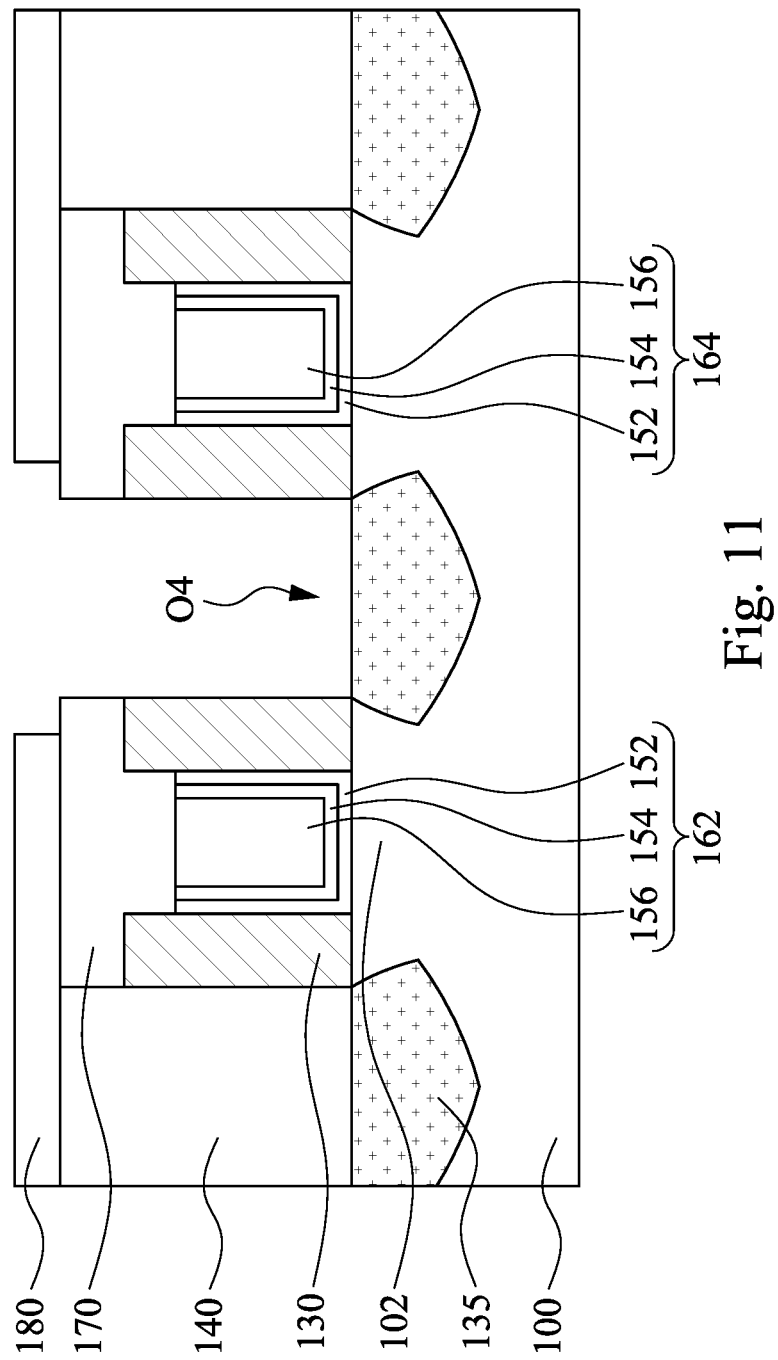

Reference is made to FIG. 11. The exposed portion of the ILD layer 140 (see FIG. 10) is removed to form an opening O4. In some embodiments, the opening O4 exposes the underlying source/drain structure 135. The exposed portion of the ILD layer 140 is removed by suitable etching process, such as wet etching, dry etching, or combination thereof. During etching the ILD layer 140, the etchant is selected to provide etching selectivity between ILD layer 140 and other structures, such as the gate spacers 130 and the protection caps 170. For example, ILD layer 140 has lower etching resistance to the etchant than the gate spacers 130 and the protection caps 170, such that the ILD layer 140 can be etched while keeping the gate spacers 130 and the protection caps 170 substantially intact.

Figure 12:
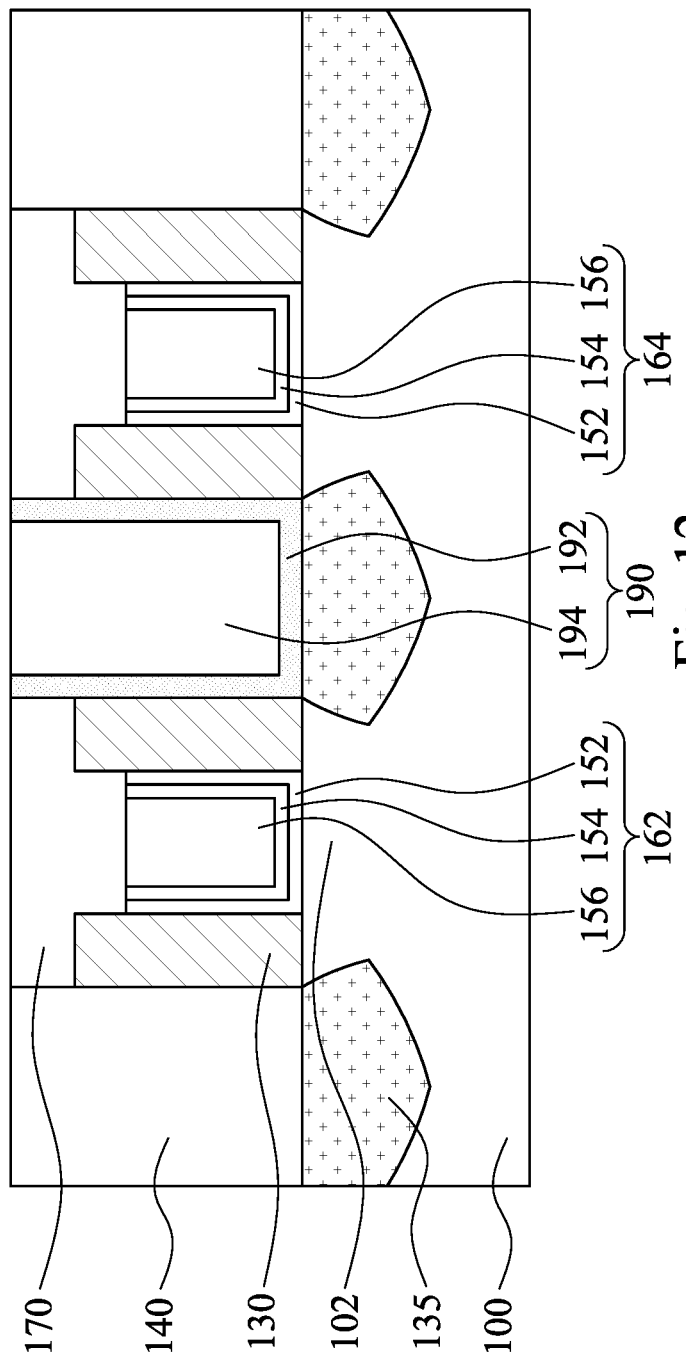

Reference is made to FIG. 12. The patterned mask 180 is removed and a source/drain contact 190 is formed. In some embodiments, the source/drain contact 190 includes a liner 192 and a plug 194. The liner 192 is between plug 194 and the underlying source/drain structure 135. In some embodiments, the liner 192 assists with the deposition of plug 194 and helps to reduce diffusion of a material of plug 194 through the gate spacers 130 and the protection caps 170. In some embodiments, the liner 192 includes titanium (Ti), titanium nitride (TiN), tantalum (Ta), tantalum nitride (TaN), or another suitable material. The Plug 194 includes a conductive material, such tungsten (W), copper (Cu), aluminum (Al), ruthenium (Ru), cobalt (Co), molybdenum (Mo), nickel (Ni), or other suitable conductive material.

Figure 13:
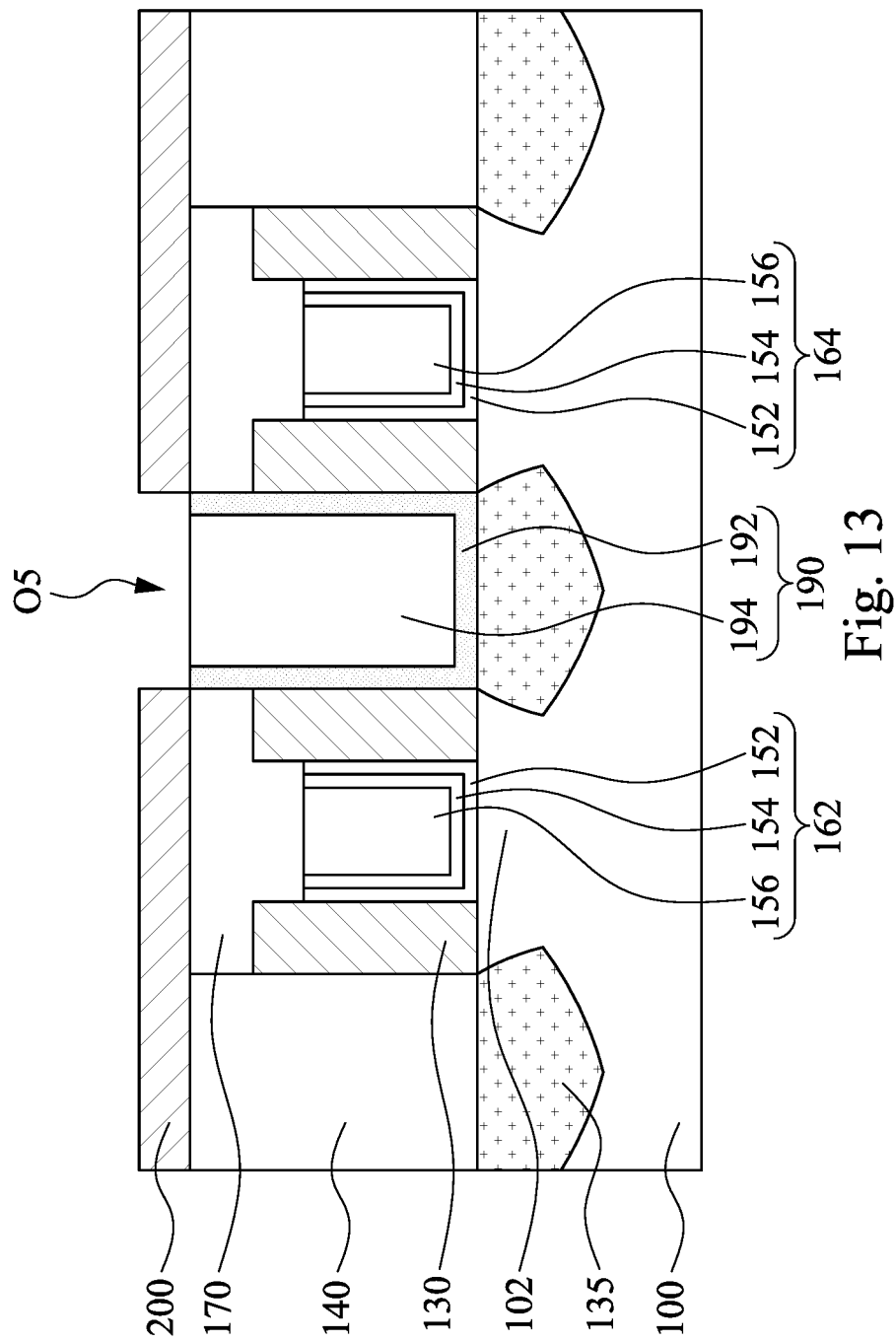

Reference is made to FIG. 13. A first etching stop layer (ESL) 200 is selectively formed over the exposed surfaces of the ILD layer 140 and the protection caps 170. For example, the first ESL 200 may be formed on the exposed surfaces of the ILD layer 140 and the protection caps 170, while leaving the exposed surface of the source/drain contact 190 uncovered. In some embodiments, the first ESL 200 includes SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN.

In some embodiments, the first ESL 200 is made of dielectric material. In some embodiments, the thickness of the first ESL 200 is in a range of about 5 nm to about 30 nm. Because the first ESL 200 is not formed on the exposed surface of the source/drain contact 190, an opening O5 is formed in the first ESL 200 and is self-aligned with the source/drain contact 190.

In some embodiments, the first ESL 200 is formed by an atomic layer deposition (ALD) process. The ALD process includes providing alternating pulses of a metal precursor and a hydroxyl precursor to a reaction chamber. Pulses of reactants saturate the surface in a self-limiting manner. An exemplary ALD process in which the first ESL 200 is formed includes the following operations. The structure of FIG. 12 is loaded into a reaction chamber. Then, a pulse of a hydroxyl precursor is injected into the reaction chamber loaded with the structure for a first period of time. Here, the hydroxyl precursor includes a chemical selected from the group consisting of $H_2O$, $H_2O_2$, and/or $O_3$. As the hydroxyl precursor is injected into the reaction chamber, a chemisorption layer of the hydroxyl precursor is selectively formed on the exposed surfaces of the ILD layer 140 and the protection caps 170, but not formed on exposed surfaces of the source/drain contact 190.

Then, the residual hydroxyl precursor is discharged from the reaction chamber for a second period of time. To more effectively discharge the residual hydroxyl precursor from the reaction chamber, purge gas may be injected into the reaction chamber during this purging period, wherein the purge gas may include an inert gas such as $N_2$, Ar, He, or similar inert gases.

After discharging the residual hydroxyl precursor from the reaction chamber, a pulse of a metal precursor is injected into the reaction chamber for a third period of time. Here, the metal precursor possesses a high reaction probability with the chemisorption layer of the hydroxyl precursor. As some examples, the metal precursor includes a tetrachloro transition metal complex. In some embodiments, the tetrachloro transition metal complex includes a chemical selected from the group consisting of $ZrCl_4$, $HfCl_4$, $AlCl_4$, and $TiCl_4$. The metal precursor reacts with the chemisorption layer of the hydroxyl precursor at a temperature of about 200° C. to about 400° C. As a result, an atomic layer of the first ESL 200 is formed on the exposed surfaces of the ILD layer 140 and the protection caps 170, but not formed on the exposed surfaces of the source/drain contact 190. That is, the selective deposition is performed such that the first ESL 200 has faster deposition rate on the ILD layer 140 and the protection caps 170 than on the source/drain contact 190.

Then, the residual metal precursor is discharged from the reaction chamber for a fourth period of time. To more effectively discharge the residual metal precursor from the reaction chamber during this fourth purging period, an inert gas such as $N_2$, Ar, He, or the like may be injected into the reaction chamber.

In some embodiments, the ALD process includes a sequence of ALD cycles, i.e., the first through fourth time periods, as described above, during which each of the hydroxyl precursor and the metal precursor is alternately injected into and thereafter discharged from the reaction chamber, when taken together are regarded as one deposition or layer formation cycle. By repeating this cycle multiple times, the first ESL 200 with a desired thickness is thereby formed.

Figure 14:
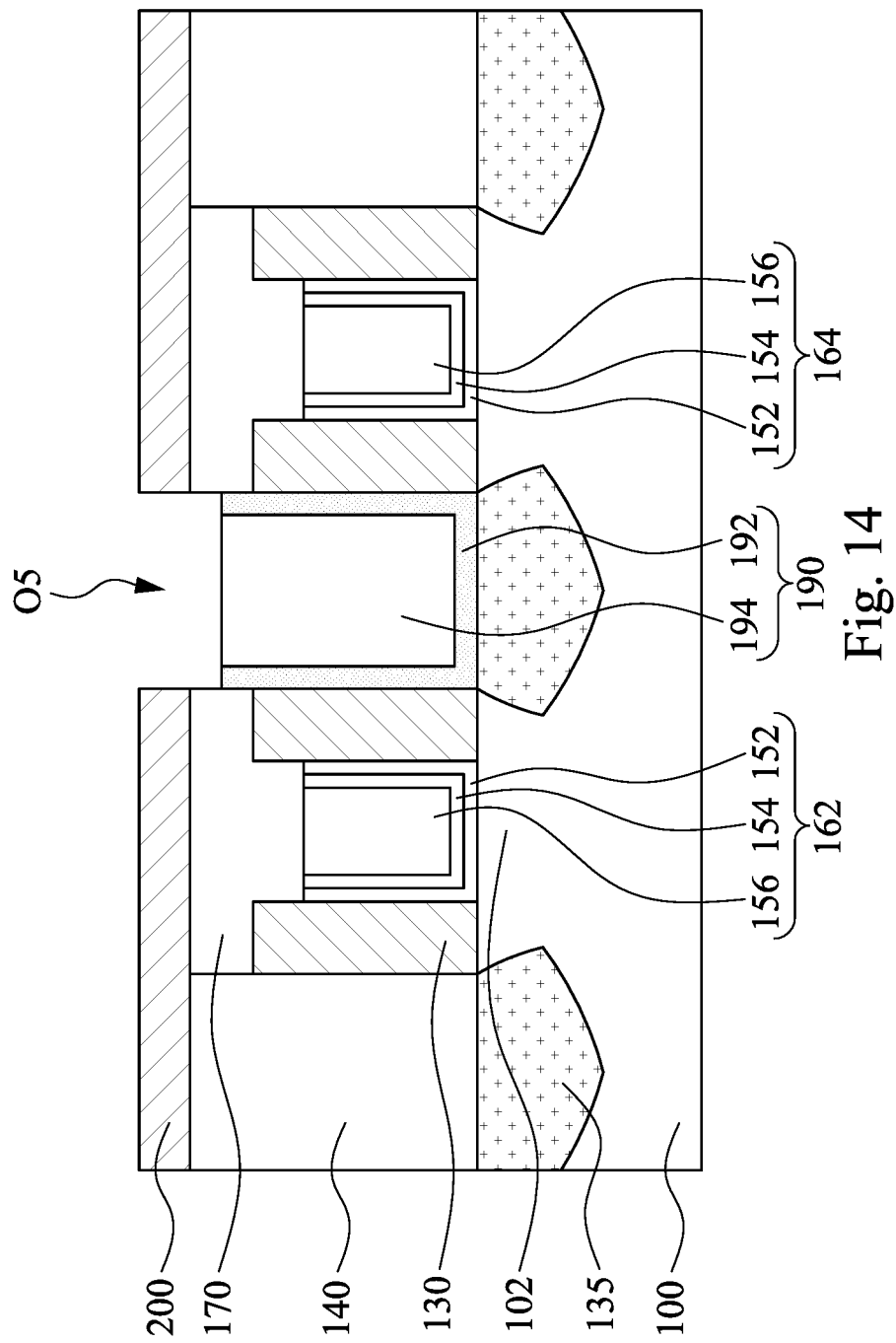

Reference is made to FIG. 14. The source/drain contact 190 is etched back. In greater details, the opening O5 is extended as the top surface of the source/drain contact 190 is pulled back. For example, the bottom surface of the opening O5 is lowered to a position below the top surface of the ILD layer 140 and the protection caps 170. As a result, the sidewalls of the protection caps 170 are exposed after the source/drain contact 190 is etched back. In some embodiments, the source/drain contact 190 can be etched by suitable process, such as wet etching, dry etching, or combination thereof. During etching back the source/drain contact 190, the etchant is selected to provide etching selectivity between source/drain contact 190 and the first ESL 200. For example, the source/drain contact 190 has lower etching resistance to the etchant than the first ESL 200, such that the source/drain contact 190 can be etched while keeping the first ESL 200 substantially intact.

Figure 15:
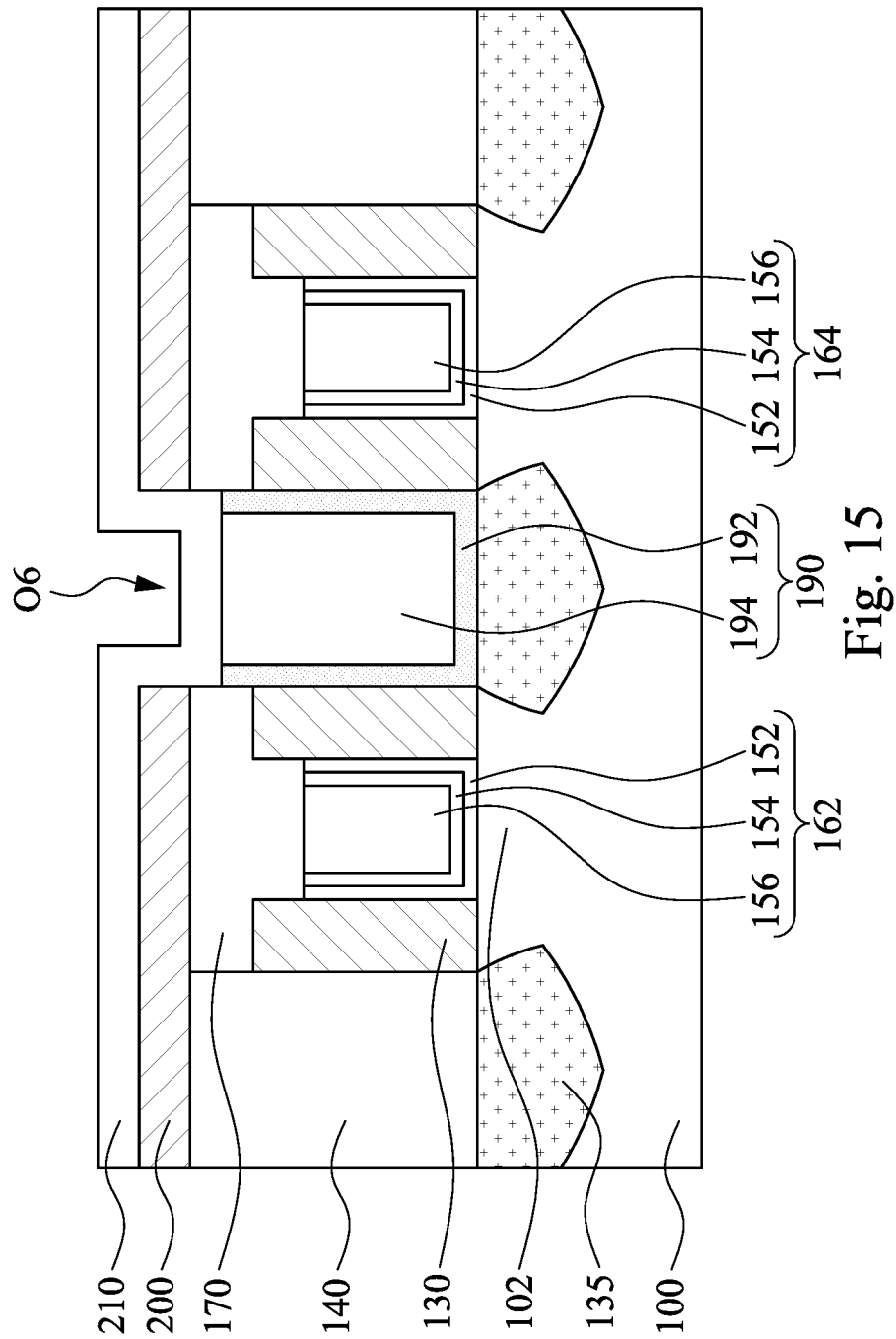

Reference is made to FIG. 15. A second etching stop layer (ESL) 210 is formed over the first ESL 200 and the exposed surface of the source/drain contact 190. In some embodiments, the second ESL is conformal to the first ESL 200, the sidewalls of the protection caps 170, and the source/drain contact 190, and an opening O6 is formed in the second ESL 210. In some embodiments, the ILD layer 140 is separated from the second ESL 210 by the first ESL 200. In some embodiments, the top surface of the protection cap 170 is separated from the second ESL 210 by the first ESL 200, while the sidewalls of the protection cap 170 are in contact with the second ESL 210. As mentioned above, the first ESL 200 is formed by a selective deposition process. However, the second ESL 210 is formed by a non-selective deposition process. For example, the first ESL 200 is selectively formed on a dielectric surface (e.g., the first ESL 200 and the protection caps 170), while the second ESL 210 can be formed on either a dielectric surface (e.g., the ILD layer 140 and the protection caps 170) or a metallic surface (e.g., the source/drain contact 190). In some embodiments, the second ESL 210 includes SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN. In some embodiments, the first ESL 200 and the second ESL are made of different material so as to provide etching selectivity in the following etching process. In some embodiments, the thickness of the second ESL 210 is in a range of about 3 nm to about 30 nm.

Figure 16:
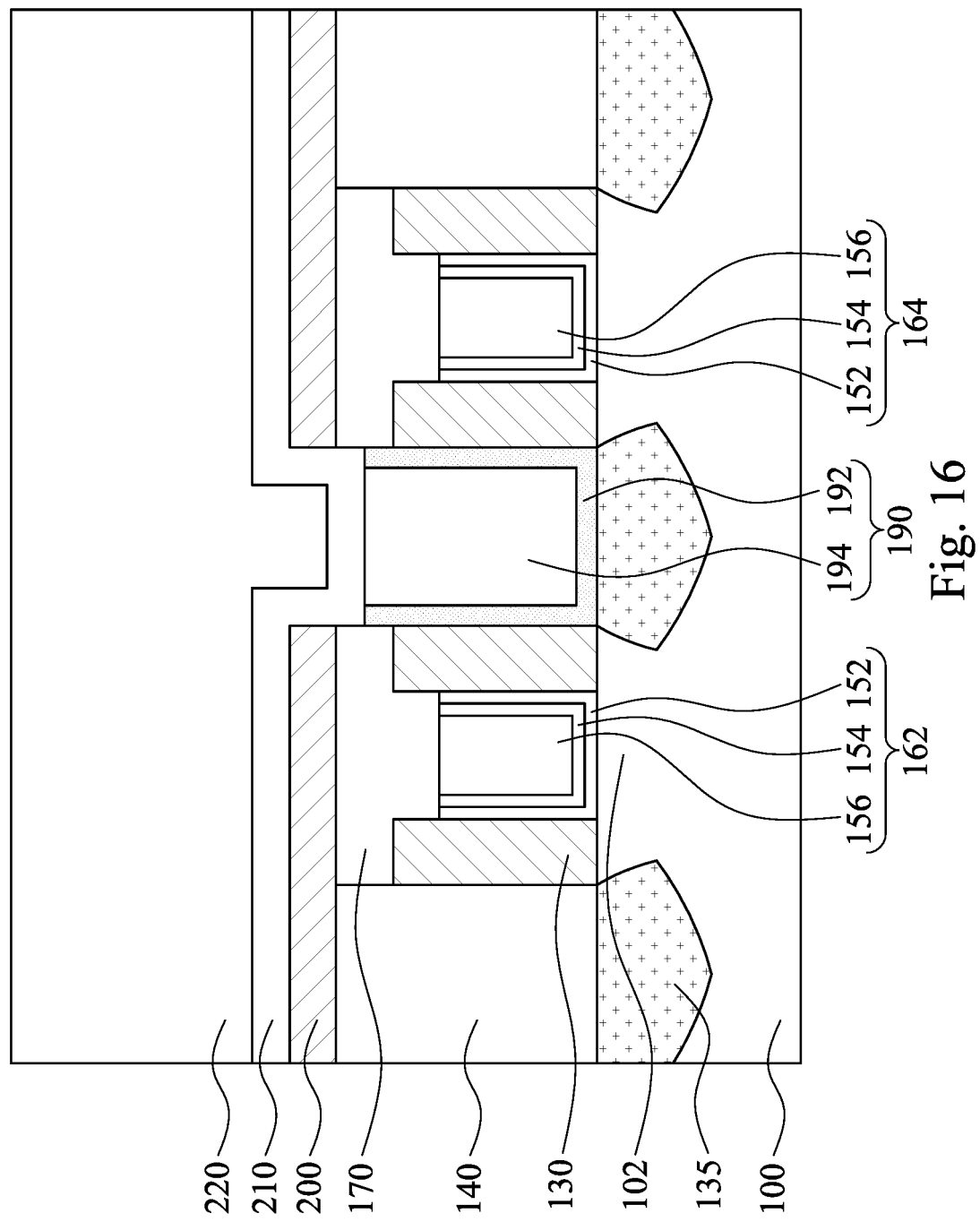

Reference is made to FIG. 16. An interlayer dielectric (ILD) layer 220 is formed over the second ESL 210. For example, a dielectric layer is deposited over the second ESL 210 and filling the opening O6 of the second ESL 210, and optionally followed by a CMP process to planarize the top surface of the dielectric layer. In some embodiments, the ILD layer 220 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 220 may be formed using, for example, CVD, ALD, spin-on-glass (SOG) or other suitable techniques.

Figure 17:
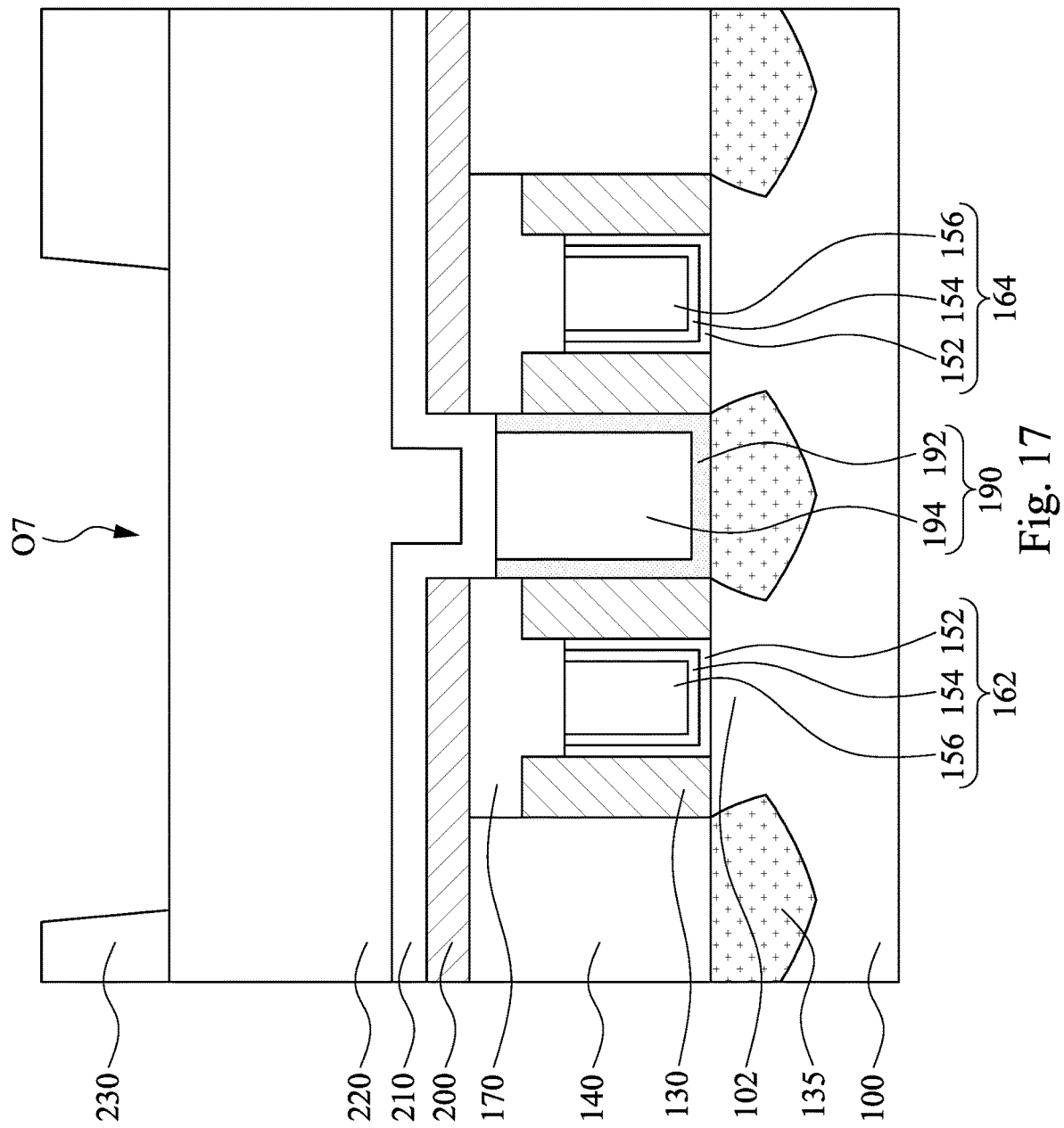

Reference is made to FIG. 17. A patterned mask 230 is formed over the ILD layer 220. In greater detail, the patterned mask 230 has an opening O7 exposing the portion of the ILD layer 220 that defines a position of a via contact formed in the following steps (e.g., the via contact 240 of FIG. 19). In some embodiments, the patterned mask 230 includes a photo resist layer. The patterned mask 230 may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer 230 to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer 230 includes a hard mask layer. The hard mask layer includes an oxide material, silicon nitride, silicon oxynitride, an amorphous carbon material, silicon carbide or tetraethylorthosilicate (TEOS).

Figure 18:
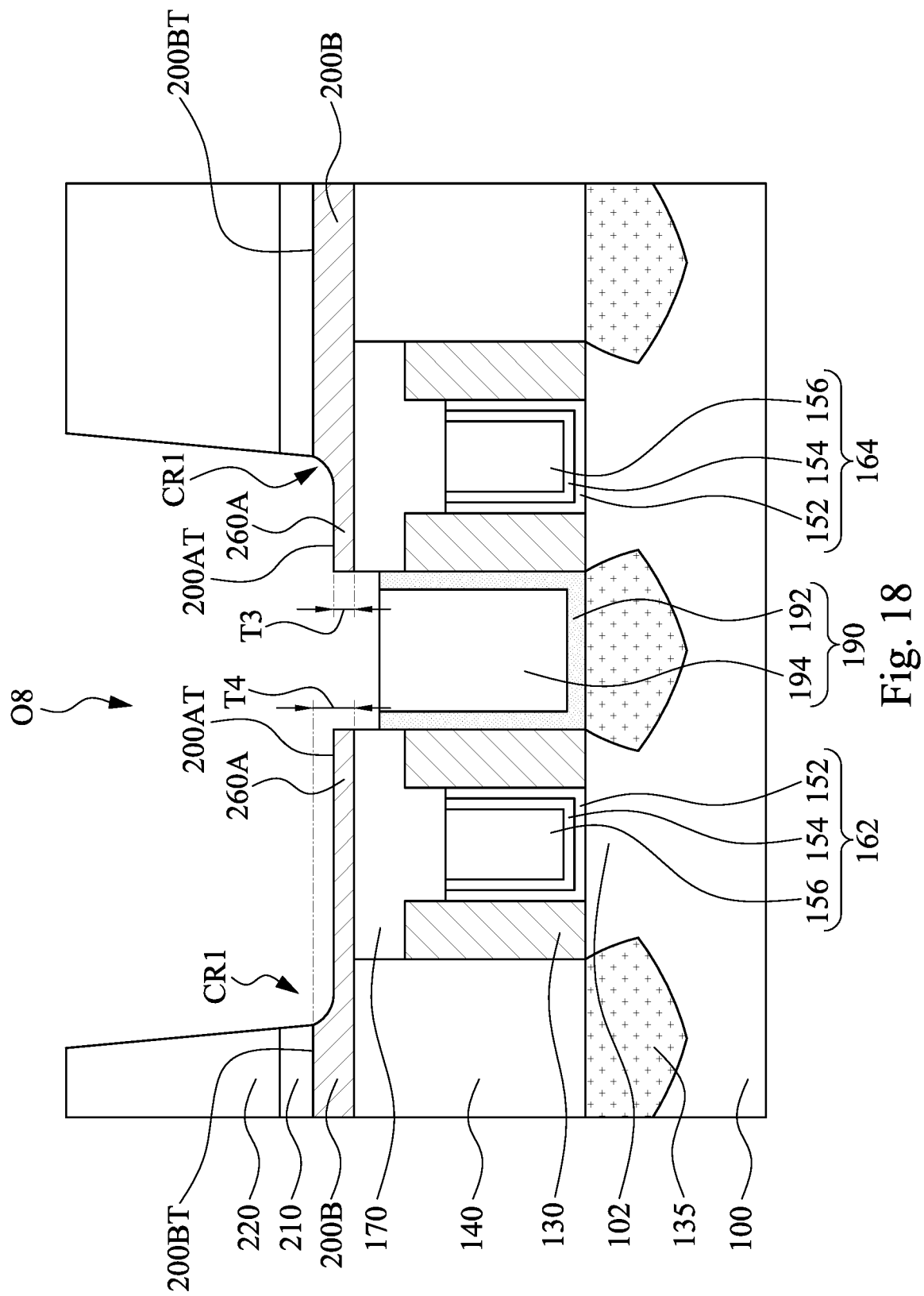

Reference is made to FIG. 18. The second ESL 210 and the ILD layer 220 are etched using the patterned mask 230 to form an via opening O8. In some embodiments, the etching process may include wet etching, dry etching, or combination thereof. After the etching process, the patterned mask 230 (see FIG. 17) is removed, and the via opening O8 exposes sidewalls of the ILD layer 220, the second ESL 210, the first ESL 200, the protection caps 170, and the top surface of the source/drain contact 190. In some embodiments, the etchant of the etching process is selected to provide etching selectivity between second ESL 210/ILD layer 220 and the first ESL 200. For example, the first ESL 200 may include higher etching resistance to the etchant of the etching process than the second ESL 210 and the ILD layer 220.

In some embodiments, the first ESL 200 may be slightly etched during the etching process, such that thickness of the first ESL 200 exposed by the via opening O8 is reduced, resulting in first portions 200A of the first ESL 200. On the other hand, the second portions 200B of the first ESL 200 covered by the patterned mask 230 (see FIG. 17) substantially remain their original thickness after the etching process. In greater detail, the first portions 200A of the first ESL 200 has a thickness T3, and the second portions 200B of the first ESL 200 has a thickness T4, in which the thickness T3 is lower than the thickness T4. In some embodiments, the difference between the thicknesses T3 and T4 is in a range of about 3 nm to about 30 nm. Stated another way, after the etching process, the first ESL 200 has a first top surface 200AT and a second top surface 200BT, in which the first top surface 200AT is lower than the second top surface 200BT. In greater detail, the first top surface 200AT is the top surface of the first portions 200A, and the second top surface 200BT is the top surface of the second portions 200B. In some embodiments, the second top surface 200BT is the top-most surface of the first ESL 200, in which second ESL 210 is in contact with the top-most surface 200BT and is separated from the first top surface 200AT of the first portions 200A. After the etching process, the via opening O8 has bottom corners CR1. In some embodiments, the bottom corners CR1 are rounded. In some embodiments, each of the rounded corners CR1 extends from the second top surface 200BT to the first top surface 200AT. In some embodiments, the via opening O8 has a bottom-most surface below the bottom surface of the first ESL 200.

With respect to the metal gate structure 162, in some embodiments, the first portion 200A of the first ESL 200 substantially overlaps the entire top surface of the metal gate structure 162. That is, the first portion 200A of the first ESL 200 substantially covers the entire top surface of the metal gate structure 162 along the normal line of the substrate 100. On the other hand, with respect to the metal gate structure 174, in some embodiments, the first portion 200A and the second portion 200B of the first ESL 200 substantially overlaps the top surface of the metal gate structure 164. That is, the first portion 200A and second portion 200B of the first ESL 200 both covers the top surface of the metal gate structure 164 along the normal line of the substrate 100.

In some embodiments of the present disclosure, because the first ESL 200 is selectively formed over the protection caps 170 and the ILD layer 140, while keeping the top surface of the source/drain contact 190 exposed. Thus, the second ESL 210 can be formed in contact with the source/drain contact 190. Accordingly, an via opening O8 can be formed self-aligned with the source/drain contact 190 after etching the second ESL 210. However, in some embodiments where the first ESL 200 is not selectively formed, the first ESL 200 may be presented between the top surface of the source/drain contact 190 and the second ESL 210, and thus an additional etching process might be needed to remove the first ESL 200 to expose the source/drain contact 190, such that the structure under first ESL 200 (e.g., protection caps 170) may be etched as well. On the other hand, since the first ESL 200 covers the protection caps 170 and the ILD layer 140 during etching the second ESL 210 and has a higher resistance to this etching process, the first ESL 200 can act as a protective layer to protect the protection caps 170 and the ILD layer 140, which will prevent the protection caps 170 from material loss during the etching process.

Figure 19:
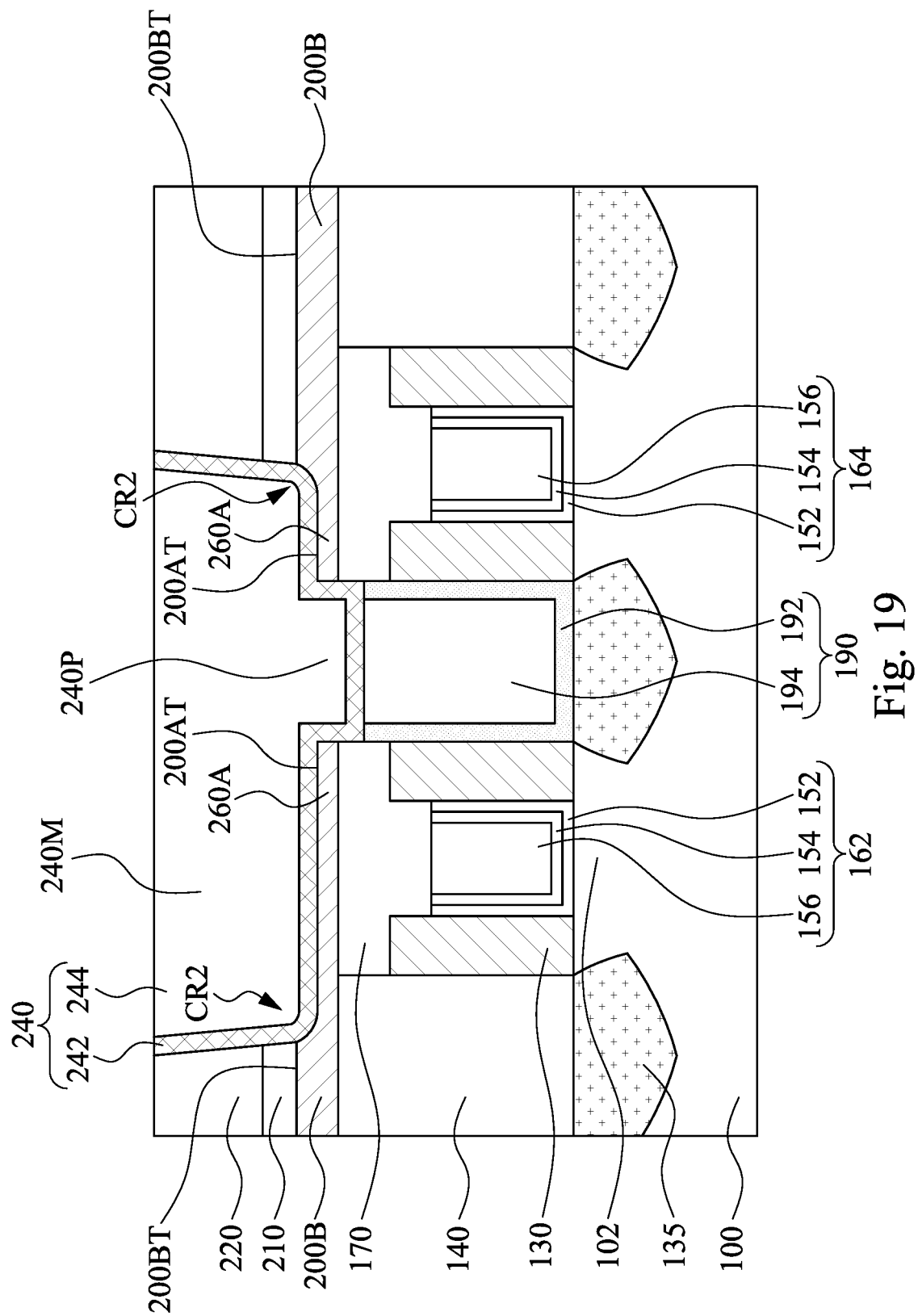

Reference is made to FIG. 19. A via contact 240 is formed in the via opening O8. In some embodiments, the via contact 240 has a main portion 240M and a protrusion portion 240P below the main portion 240M, in which the main portion 240M is wider than the protrusion portion 240P. In greater detail, the main portion 240M indicates the portion of the via contact 240 that is between the ILD layer 220, and the protrusion portion 240P indicates the portion of the via contact 240 that fills the space between the protection caps 170 and in contact with the source/drain contact 190. In some embodiments, the protrusion portion 240P of the via contact 240 is in contact with the sidewalls of the first portions 200A of the first ESL 200, the sidewalls of the protection caps 170, and the top surface of the source/drain contact 190. In some embodiments, the thickness of the protrusion portion 240P of the via contact 240 is in a range of about 5 nm to about 50 nm. On the other hand, the main portion 240M is in contact with the top surface 240AT of the first portions 200A of the first ESL 200 and rounded sidewalls of the second portions 200B. Moreover, the main portion 240M has bottom corners CR2 that inherit the profile of the bottom corners CR1 of the via opening O8. Thus, the bottom corners CR2 of the main portion 240M has a rounded profile, in which the rounded profile extends from the second top surface 200BT of the second portion 200B of the first ESL 200 to the first top surface 200AT of the first portion 200A of the first ESL 200. In some embodiments, the horizontal interface between the via contact 240 and the first ESL 200 is lower than a top-most surface 200BT of the first ESL 200.

In some embodiments, the via contact 240 includes a liner 242 and a plug 244. In some embodiments, the liner 242 assists with the deposition of plug 244 and helps to reduce diffusion of a material of plug 244 through the ILD layer 220. In some embodiments, the liner 242 includes titanium (Ti), titanium nitride (TiN), tantalum (Ta), tantalum nitride (TaN), or another suitable material. The Plug 244 includes a conductive material, such tungsten (W), copper (Cu), aluminum (Al), ruthenium (Ru), cobalt (Co), molybdenum (Mo), nickel (Ni), or other suitable conductive material. In some embodiments, the via contact 240 can be formed by, for example, removing the patterned mask 230, sequentially depositing a liner material and a plug material into the via opening O8, and followed by a CMP process to remove excessive materials of the liner material and the plug material until the top surface of the ILD layer 220 is exposed.

Figure 20A:
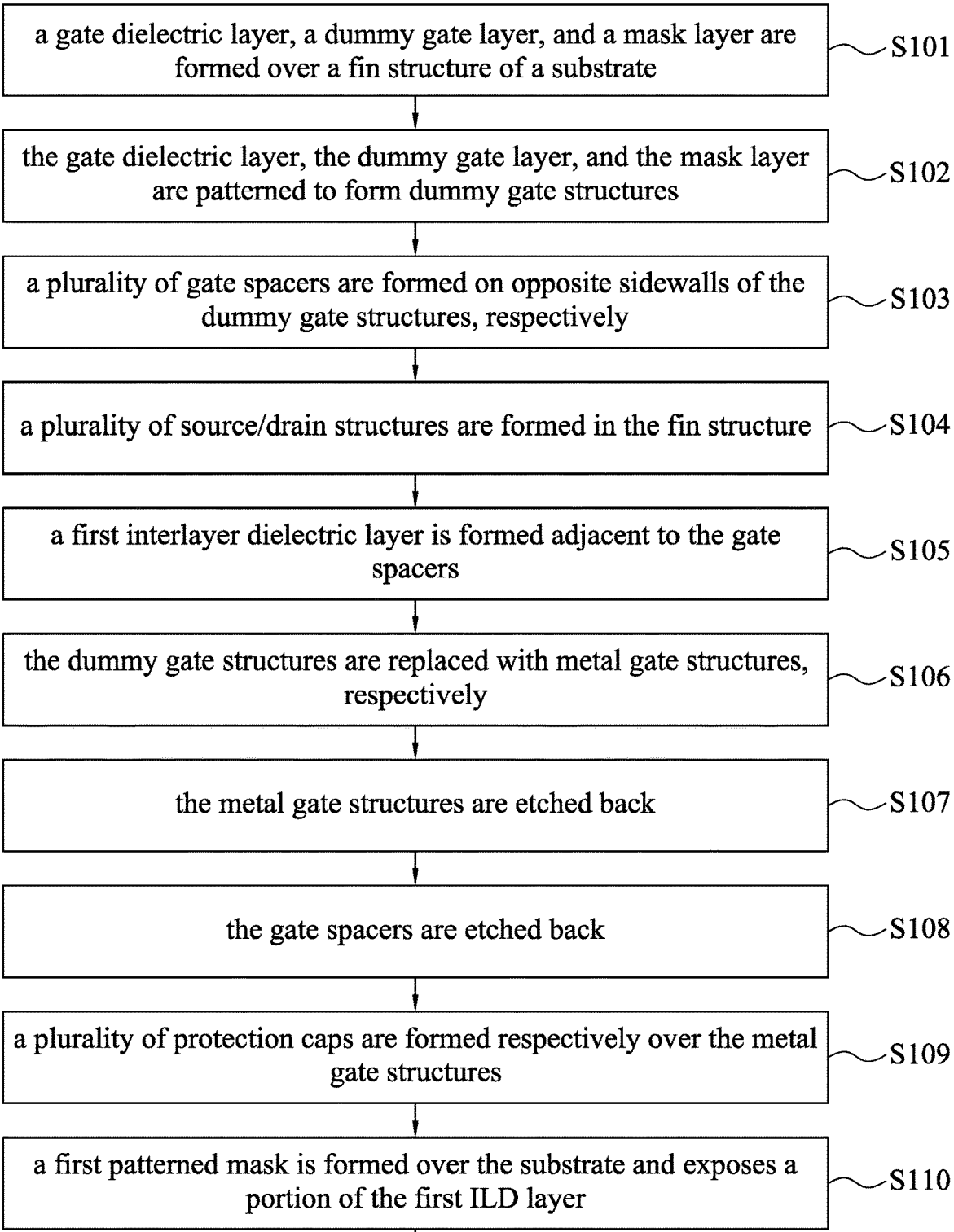
FIGS. 20A and 20B illustrate a method of forming a semiconductor device in accordance with some embodiments of the present disclosure.
Figure 20B:
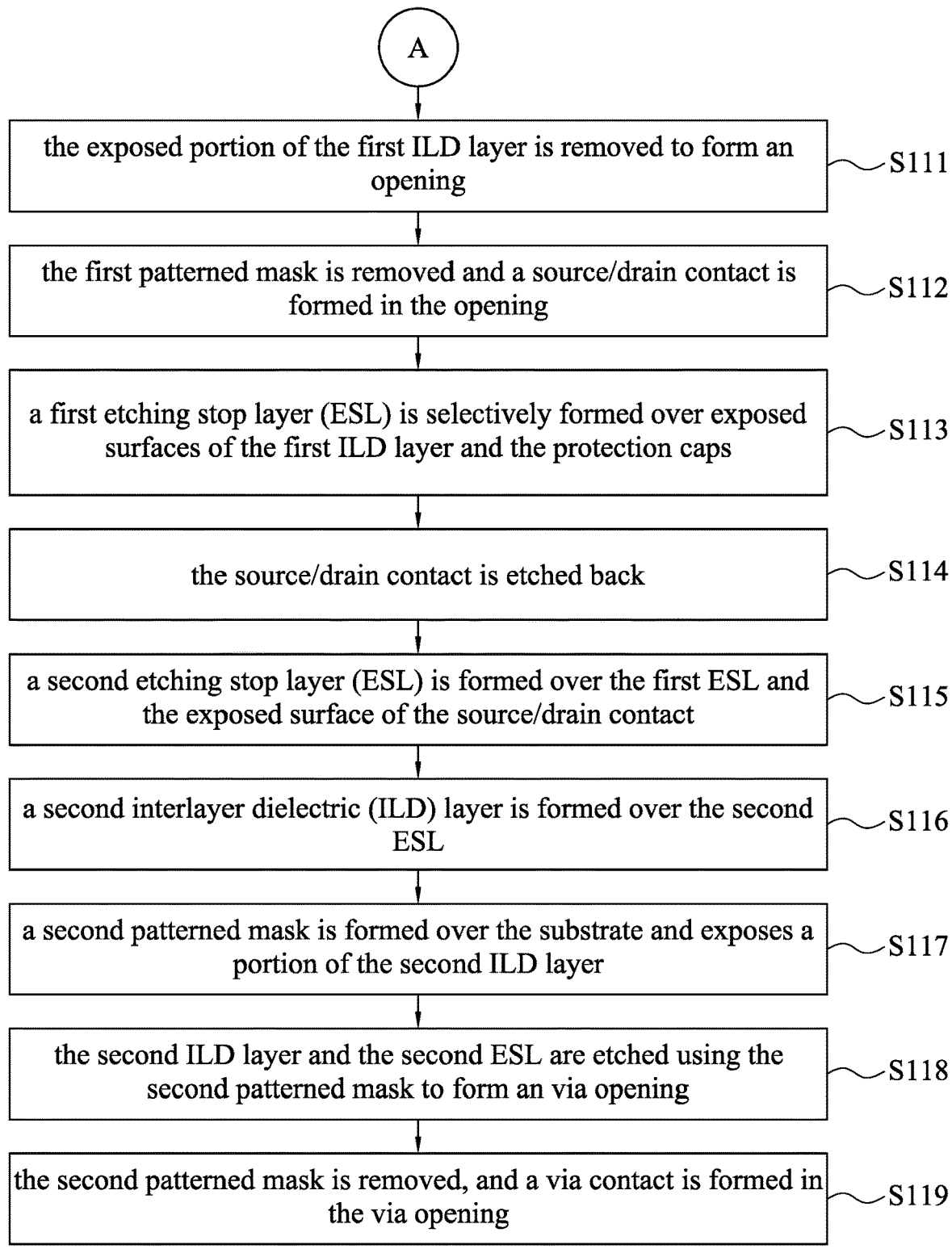

FIGS. 20A and 20B illustrate a method M1 of forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a gate dielectric layer, a dummy gate layer, and a mask layer are formed over a fin structure of a substrate. FIG. 1 illustrates a cross-sectional view of some embodiments corresponding to act in block S101.

At block S102, the gate dielectric layer, the dummy gate layer, and the mask layer are patterned to form dummy gate structures. FIG. 2 illustrates a cross-sectional view of some embodiments corresponding to act in block S102.

At block S103, a plurality of gate spacers are formed on opposite sidewalls of the dummy gate structures, respectively. FIG. 3 illustrates a cross-sectional view of some embodiments corresponding to act in block S103.

At block S104, a plurality of source/drain structures are formed in the fin structure. FIG. 4 illustrates a cross-sectional view of some embodiments corresponding to act in block S104.

At block S105, a first interlayer dielectric layer is formed adjacent to the gate spacers. FIG. 5 illustrates a cross-sectional view of some embodiments corresponding to act in block S105.

At block S106, the dummy gate structures are replaced with metal gate structures, respectively. FIG. 6 illustrates a cross-sectional view of some embodiments corresponding to act in block S106.

At block S107, the metal gate structures are etched back. FIG. 7 illustrates a cross-sectional view of some embodiments corresponding to act in block S107.

At block S108, the gate spacers are etched back. FIG. 8 illustrates a cross-sectional view of some embodiments corresponding to act in block S108.

At block S109, a plurality of protection caps are formed respectively over the metal gate structures. FIG. 9 illustrates a cross-sectional view of some embodiments corresponding to act in block S109.

At block S110, a first patterned mask is formed over the substrate and exposes a portion of the first ILD layer. FIG. 10 illustrates a cross-sectional view of some embodiments corresponding to act in block S110.

At block S111, the exposed portion of the first ILD layer is removed to form an opening. FIG. 11 illustrates a cross-sectional view of some embodiments corresponding to act in block S111.

At block S112, the first patterned mask is removed and a source/drain contact is formed in the opening. FIG. 12 illustrates a cross-sectional view of some embodiments corresponding to act in block S112.

At block S113, a first etching stop layer (ESL) is selectively formed over exposed surfaces of the first ILD layer and the protection caps, while leaving an exposed surface of the source/drain contact uncovered. FIG. 13 illustrates a cross-sectional view of some embodiments corresponding to act in block S113.

At block S114, the source/drain contact is etched back. FIG. 14 illustrates a cross-sectional view of some embodiments corresponding to act in block S114.

At block S115, a second etching stop layer (ESL) is formed over the first ESL and the exposed surface of the source/drain contact. FIG. 15 illustrates a cross-sectional view of some embodiments corresponding to act in block S115.

At block S116, a second interlayer dielectric (ILD) layer is formed over the second ESL. FIG. 16 illustrates a cross-sectional view of some embodiments corresponding to act in block S116.

At block S117, a second patterned mask is formed over the substrate and exposes a portion of the second ILD layer. FIG. 17 illustrates a cross-sectional view of some embodiments corresponding to act in block S117.

At block S118, the second ILD layer and the second ESL are etched using the second patterned mask to form an via opening. FIG. 18 illustrates a cross-sectional view of some embodiments corresponding to act in block S118.

At block S119, the second patterned mask is removed, and a via contact is formed in the via opening. FIG. 19 illustrates a cross-sectional view of some embodiments corresponding to act in block S119.

FIGS. 21 to 26 illustrate a method in various stages of fabricating a semiconductor device in accordance with some embodiments of the present disclosure.

Figure 21:
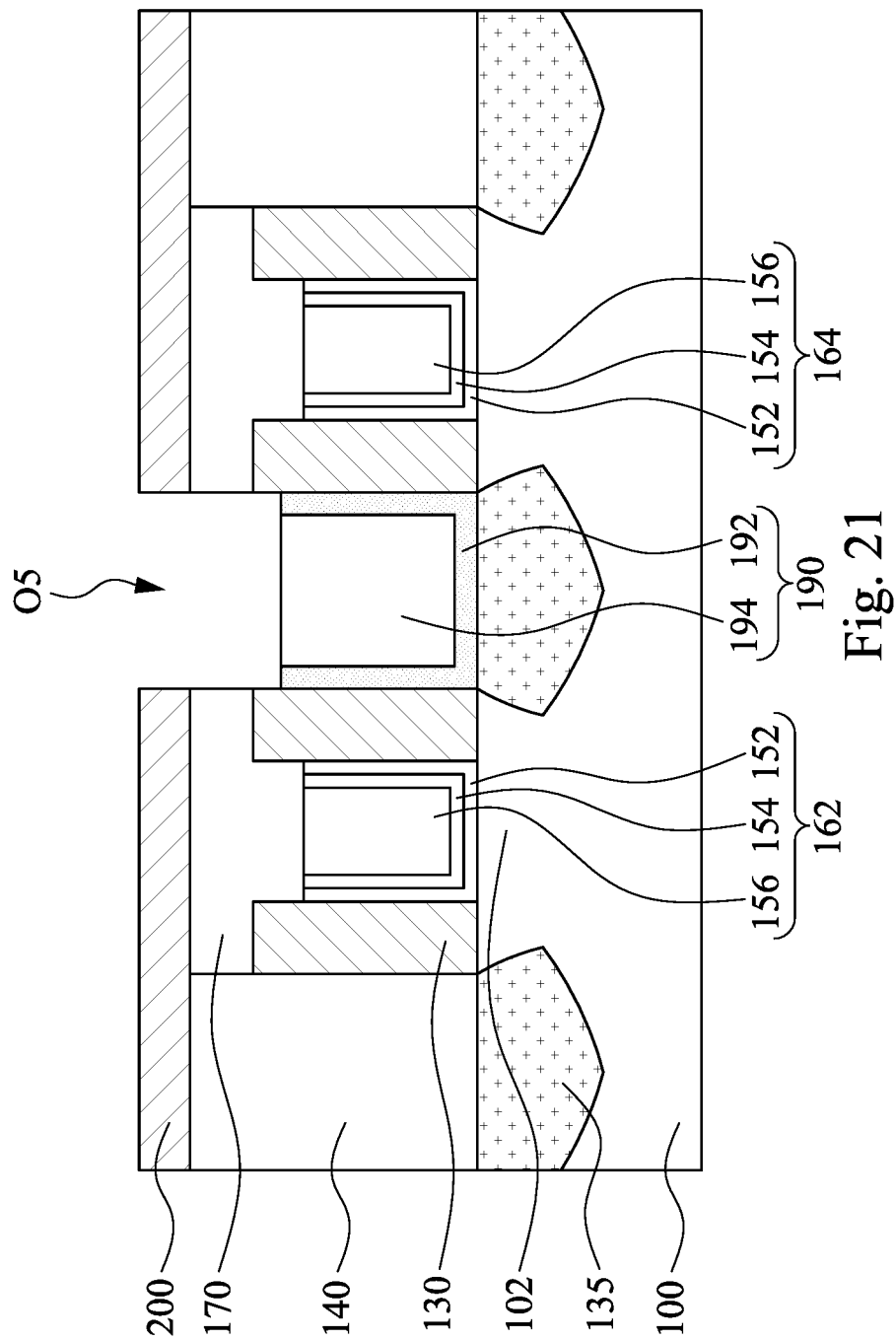
FIGS. 21 to 26 illustrate a method in various stages of fabricating a semiconductor device in accordance with some embodiments of the present disclosure.

Reference is made to FIG. 21. The initial structure of FIG. 21 is similar to that described in FIG. 15, and thus relevant structure and process details will not be repeated hereinafter. Further, similar elements in FIG. 21 is different from FIG. 15, in that the source/drain contact 190 is etched back to extend the opening O5, while the bottom surface of the opening O5 is lowed to a position below the top surfaces of the gate spacers 130. In some embodiments, the distance between the top surface of the source/drain contact 190 and the top surface of the first ESL 200 is in a range of about 5 nm to about 30 nm.

Figure 22:
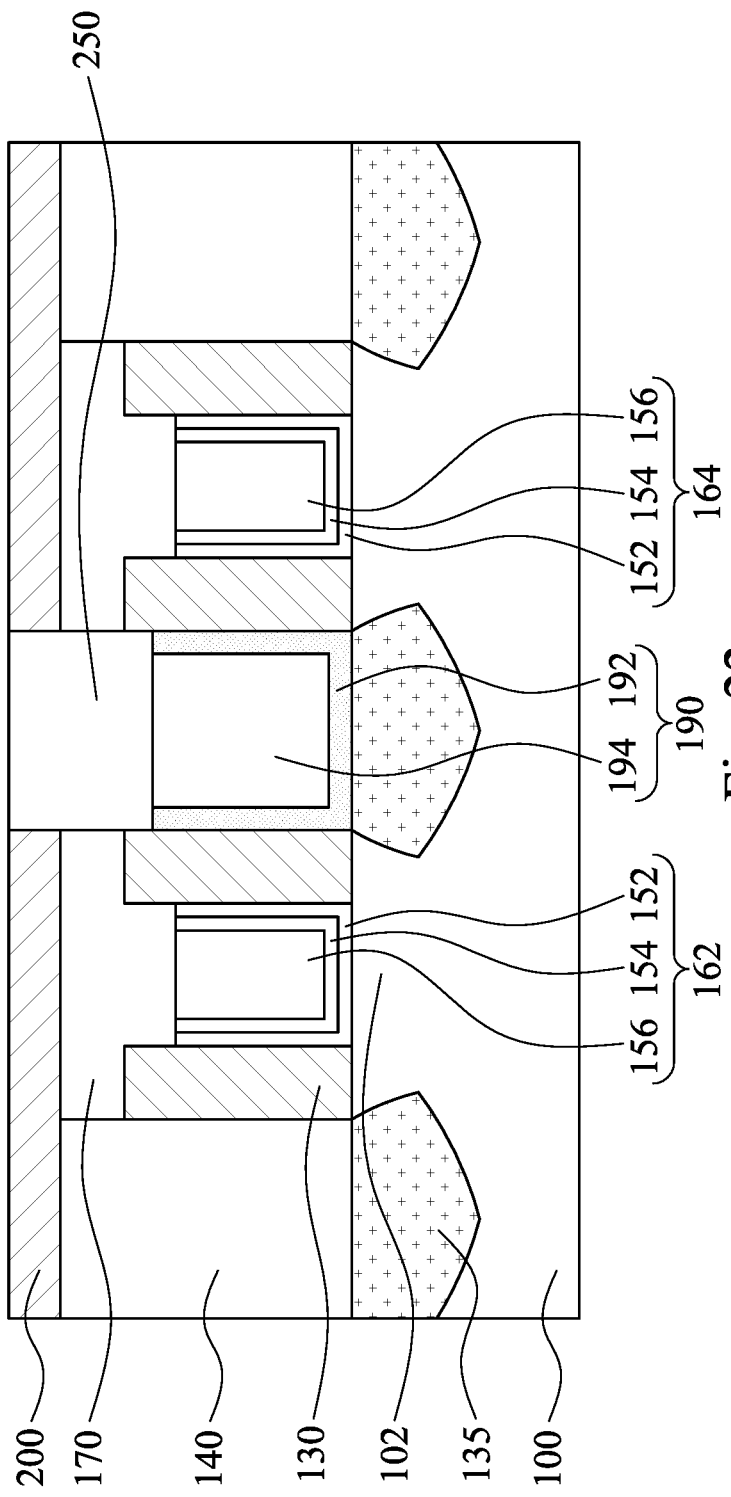

Reference is made to FIG. 22. A metal cap 250 is selectively formed over the source/drain contact 190. In some embodiments, the metal cap 250 can be formed by selectively depositing a conductive material over the source/drain contact 190 and filling the opening O5, and followed by a CMP process to remove excessive conductive material until the top surface of the first ESL 200 is exposed. In some embodiments, the metal cap 250 includes W, Ru, Co, Cu, Ti, TiN, Ta, TaN, Mo, Ni. The thickness of the metal cap 250 is in a range of about 5 nm to about 50 nm. In some embodiments, the metal cap 250 and the source/drain contact 190 includes different materials, and thus a visible interface between the metal cap 250 and the source/drain contact 190 may exist in the final product. In some other embodiments, the metal cap 250 and the source/drain contact 190 may include the same material.

The metal cap 250 can be formed using a selective deposition process that deposits the metal cap 250 on the metallic surfaces (e.g., the source/drain contact 190) but does not significantly deposit on dielectric surfaces (e.g., the first ESL 200). That is, the selective deposition process is performed such that the metal cap 250 has faster deposition rate on the source/drain contact 190 than the first ESL 200.

In some examples, the selective deposition is a fluorine-free tungsten deposition, and hence, the metal cap 250 can be free of fluorine. In some examples, the selective deposition process, which further is a fluorine-free tungsten deposition, is an ALD process that uses a hydrogen ($H_2$) precursor and a tungsten chloride precursor. The tungsten chloride precursor can be tungsten (V) chloride ($WCl_5$), tungsten(VI) chloride ($WCl_6$), another tungsten chloride, or a combination thereof. In some examples, a cycle of the ALD process can include sequentially flowing the tungsten chloride precursor, purging the tungsten chloride precursor, flowing the hydrogen precursor, and purging the hydrogen precursor. In some examples, a cycle of the ALD process can include sequentially flowing the hydrogen precursor, purging the hydrogen precursor, flowing the tungsten chloride precursor, and purging the tungsten chloride precursor. The ALD process can include performing the cycle any number of times, such as in a range from about 150 cycles to about 320 cycles. Flowing the tungsten chloride can also include flowing a carrier gas, such as argon, nitrogen, helium, or the like.

It is believed that the high electron mobility of metallic surfaces (e.g., the source/drain contact 190) permits the tungsten chloride to react more easily with the metallic surfaces than dielectric surfaces (e.g., the first ESL 200), which have a lower electron mobility. In the above-described ALD process, it is believed that tungsten chloride reacts with the metallic surface to form a bond between a material of the metallic surface and tungsten chloride ($WCl_x$) and to form a bond between a material of the metallic surface and chlorine that is released from the tungsten chloride precursor. When the hydrogen precursor is flowed, it is believed that the hydrogen reacts with chlorine bonded with the metallic surface and/or chlorine of the tungsten chloride ($WCl_x$) bonded with the metallic surface to form hydrochloric acid (HCl), which is formed as a gaseous byproduct and purged in the flowing and purging of the hydrogen precursor. Tungsten can therefore be formed on the metallic surfaces. The formed tungsten may include residual chlorine, such as less than about 1%.

In other examples, other processes may be implemented to form the source/drain contact 190. For example, any process that permits the selective deposition of a metal on a metallic surface can be implemented, such as a CVD, ALD, or another deposition technique that can selectively deposit, for example, cobalt, manganese, tungsten, or another metal or metallic material. An example is selective deposition of cobalt by a CVD process. The CVD process can use a cobalt carbonyl precursor mixed with an inert carrier gas.

Figure 23:
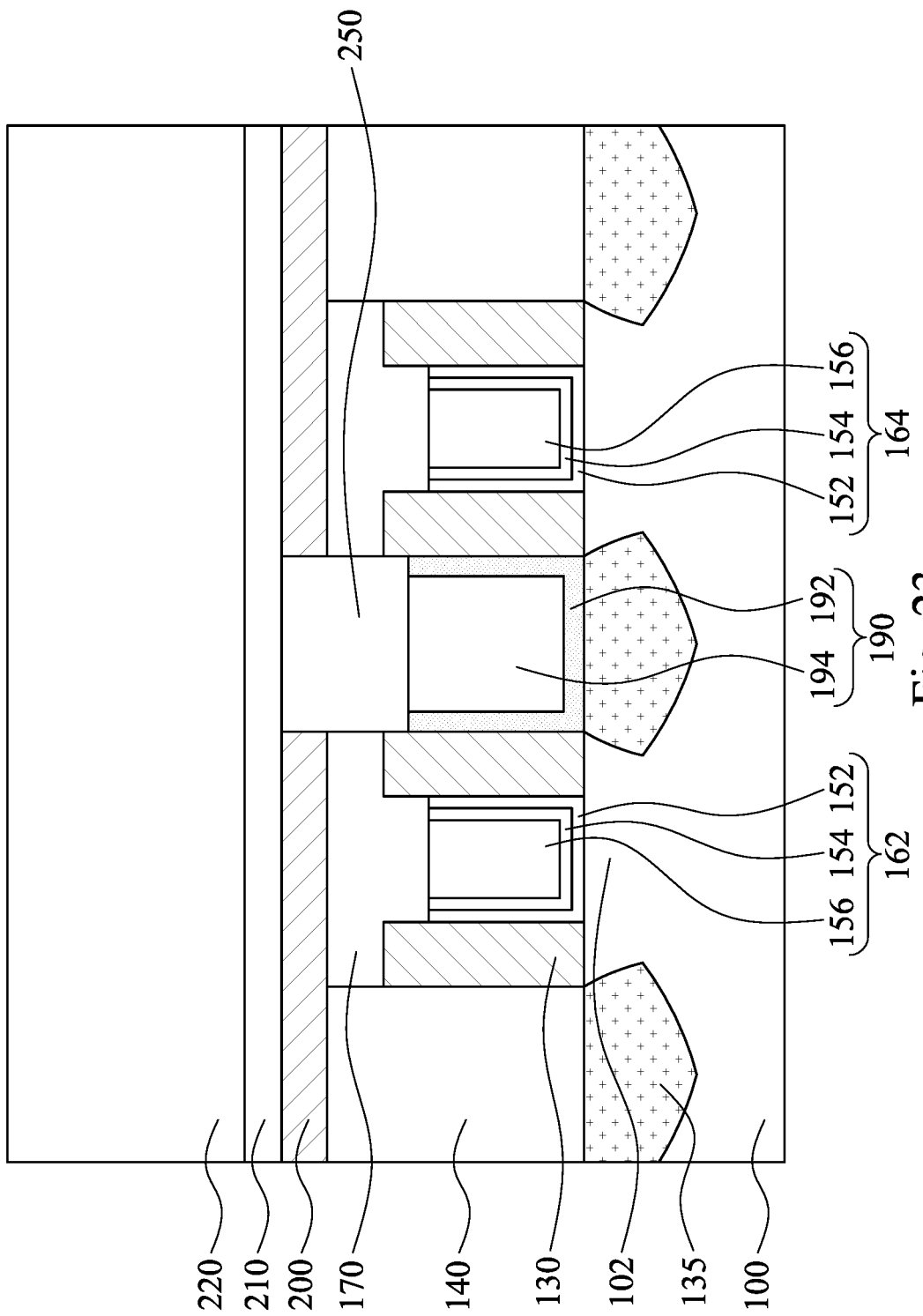

Reference is made to FIG. 23. A second ESL 210 and an ILD layer 220 are formed over the first ESL 200 and the metal cap 250. The materials and formation method of the second ESL 210 and the ILD layer 220 are described above with respect to FIGS. 15 and 16, and thus relevant details are omitted for simplicity.

Figure 24:
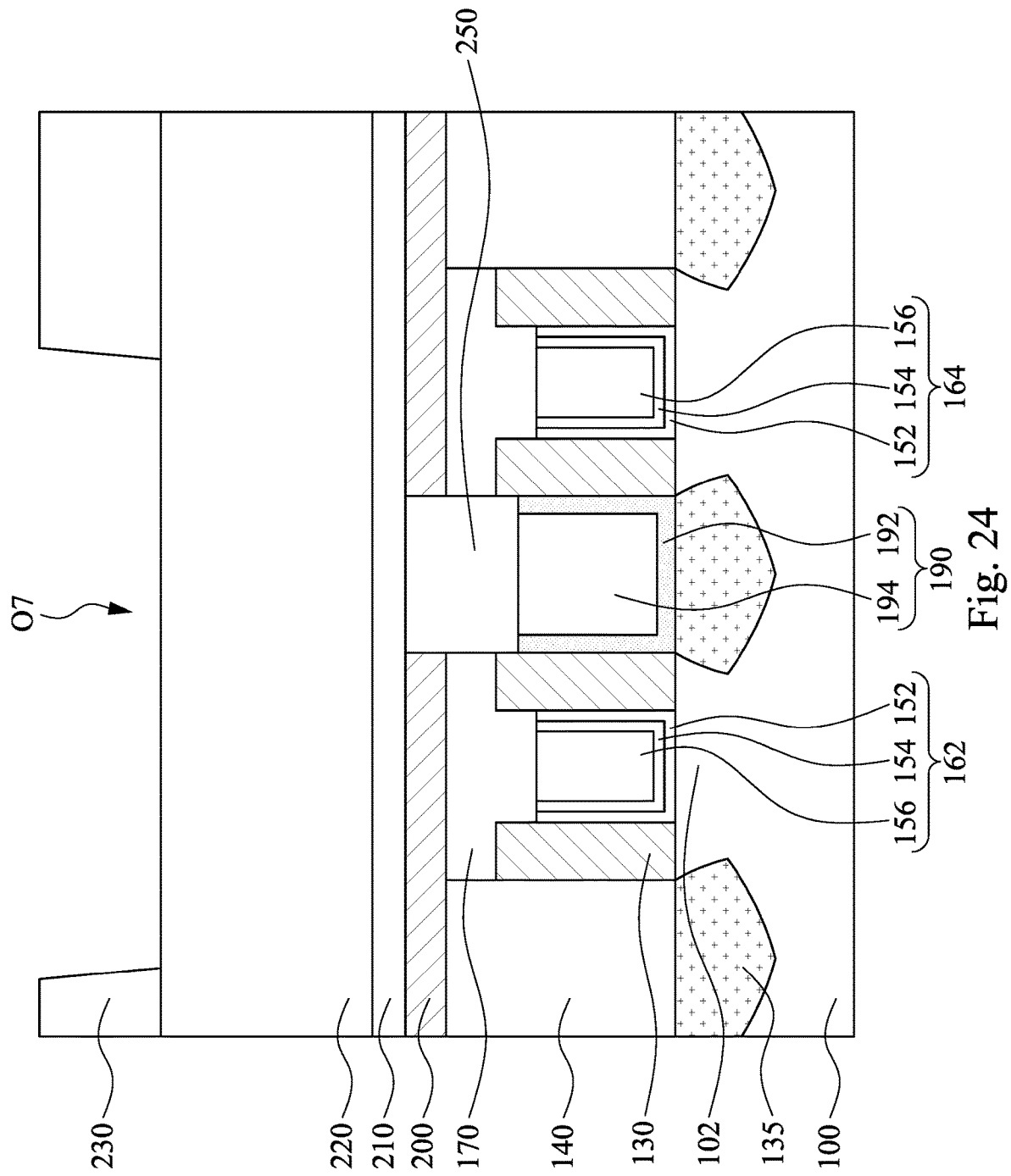

Reference is made to FIG. 24. A patterned mask 230 is formed over the substrate 100 and exposes a portion of the ILD layer 220. The materials and formation method of the patterned mask 230 are described above with respect to FIG. 17, and thus relevant details are omitted for simplicity.

Figure 25:
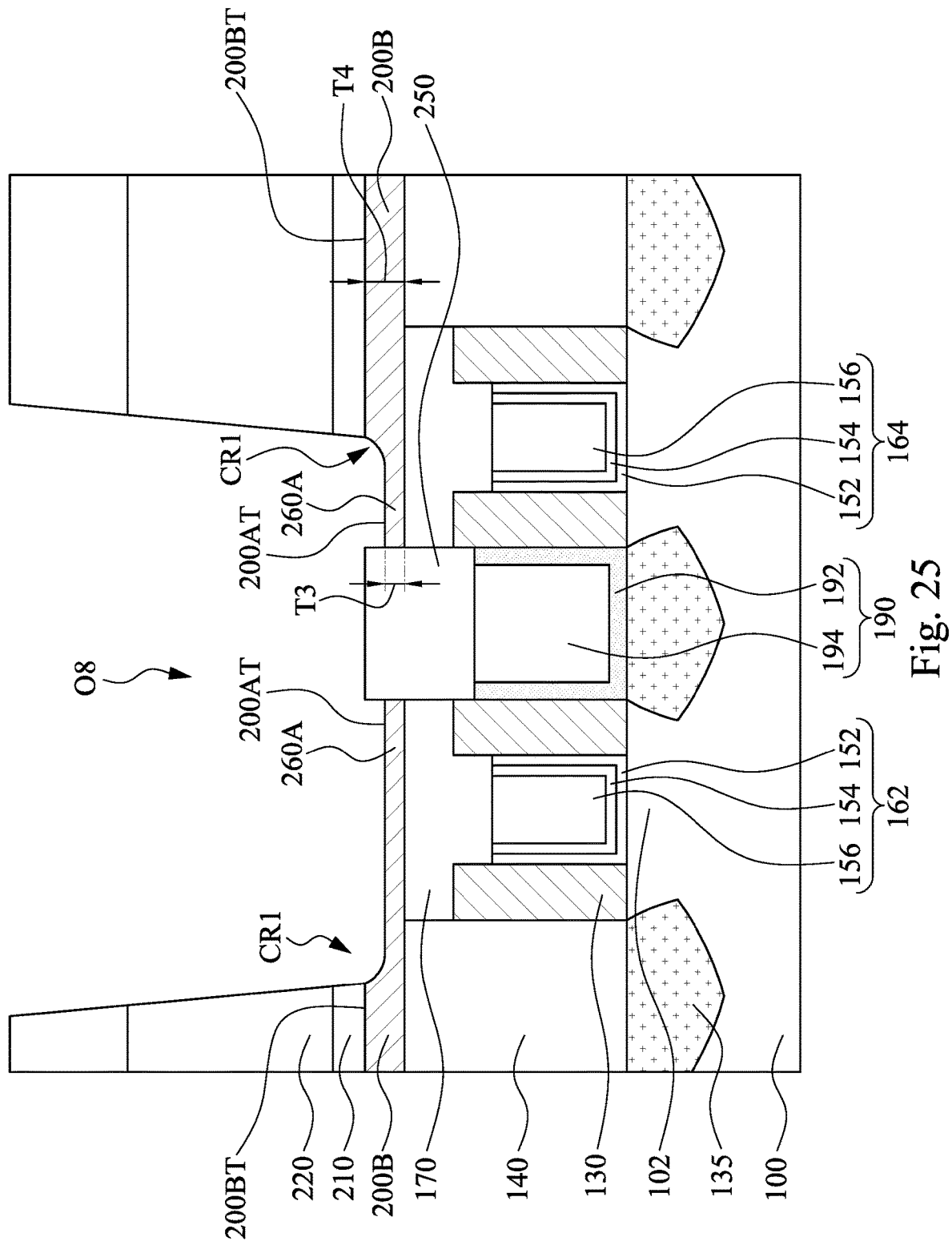

Reference is made to FIG. 25. The second ESL 210 and the ILD layer 220 are etched using the patterned mask 230 to form an via opening O8. As mentioned above with respect to FIG. 18, after the etching process, the first ESL 200 may be slightly etched, resulting in first portions 200A and second portions 200B. In some embodiments, the first ESL 200 has a higher etching resistance to the etching process than the second ESL 210 and the ILD layer 220. On the other hand, the metal cap 250 has a higher etching resistance to the etching process than the first ESL 200, which resulting in the metal cap 250 protruding from first top surface 200AT of the first portions 200A of the first ESL 200. In some other embodiments, the top surface of the metal cap 250 is substantially level with the second top surface 200BT of the second portions 200B of the first ESL 200.

In some embodiments of the present disclosure, the metal cap 250 has a higher etching resistance to the etching process than the source/drain contact 190. For example, in some embodiments where the metal cap 250 is omitted, the source/drain contact 190 may be exposed to the etchant of the etching process during forming the via opening O8, which might result in material loss of the source/drain contact 190. As a result, by forming the metal cap 250, which has higher etching resistance to the etching process than the source/drain contact 190, over the source/drain contact 190 prior to etching the second ESL 210, the metal cap 250, the metal cap 250 can protect the source/drain contact 190 from being etched during forming the via opening O8, which will improve the quality and performance of the device. For example, the RC delay will be improved about 1-2% where the metal cap 250 is formed.

Figure 26:
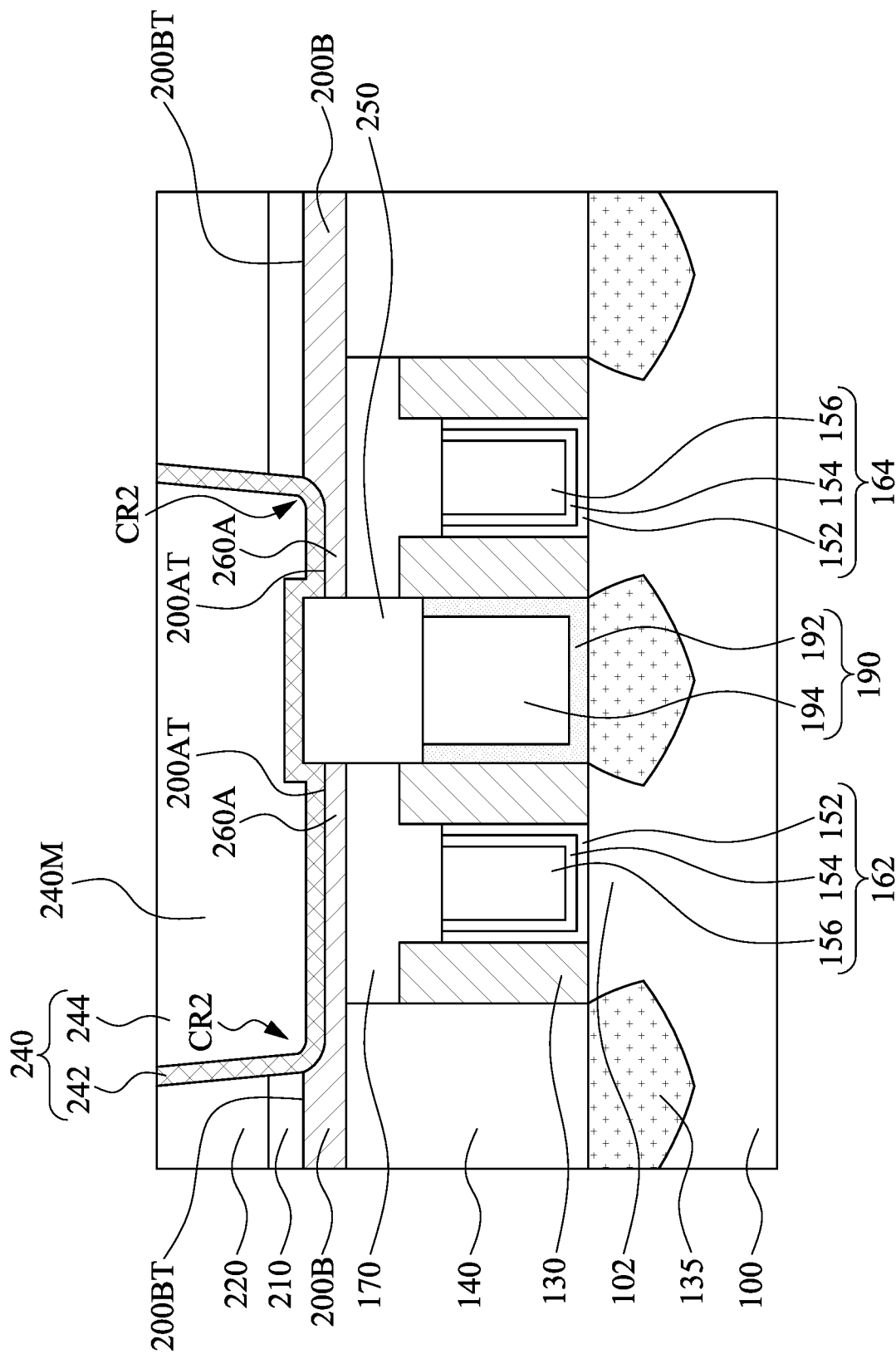

Reference is made to FIG. 26. A via contact 240 is formed in the via opening O8. The materials and formation method of the via contact 240 are described above with respect to FIG. 19, and thus relevant details are omitted for simplicity. FIG. 26 is different from FIG. 19, in that the via contact 240 is electrically connected to the source/drain contact 190 through the metal cap 250. In some embodiments, the entirety of the via contact 240 is above the protection caps 170. In some embodiments, the metal cap 250 is embedded in the via contact 240, such that the top surface of the metal cap 250 is lower than the bottom surface of the via contact 240. Stated another way, the horizontal interface between the metal cap 250 and the via contact 240 is higher than the horizontal interface between the first ESL 200 (e.g., the first portions 200A) and the via contact 240.

Figure 27A:
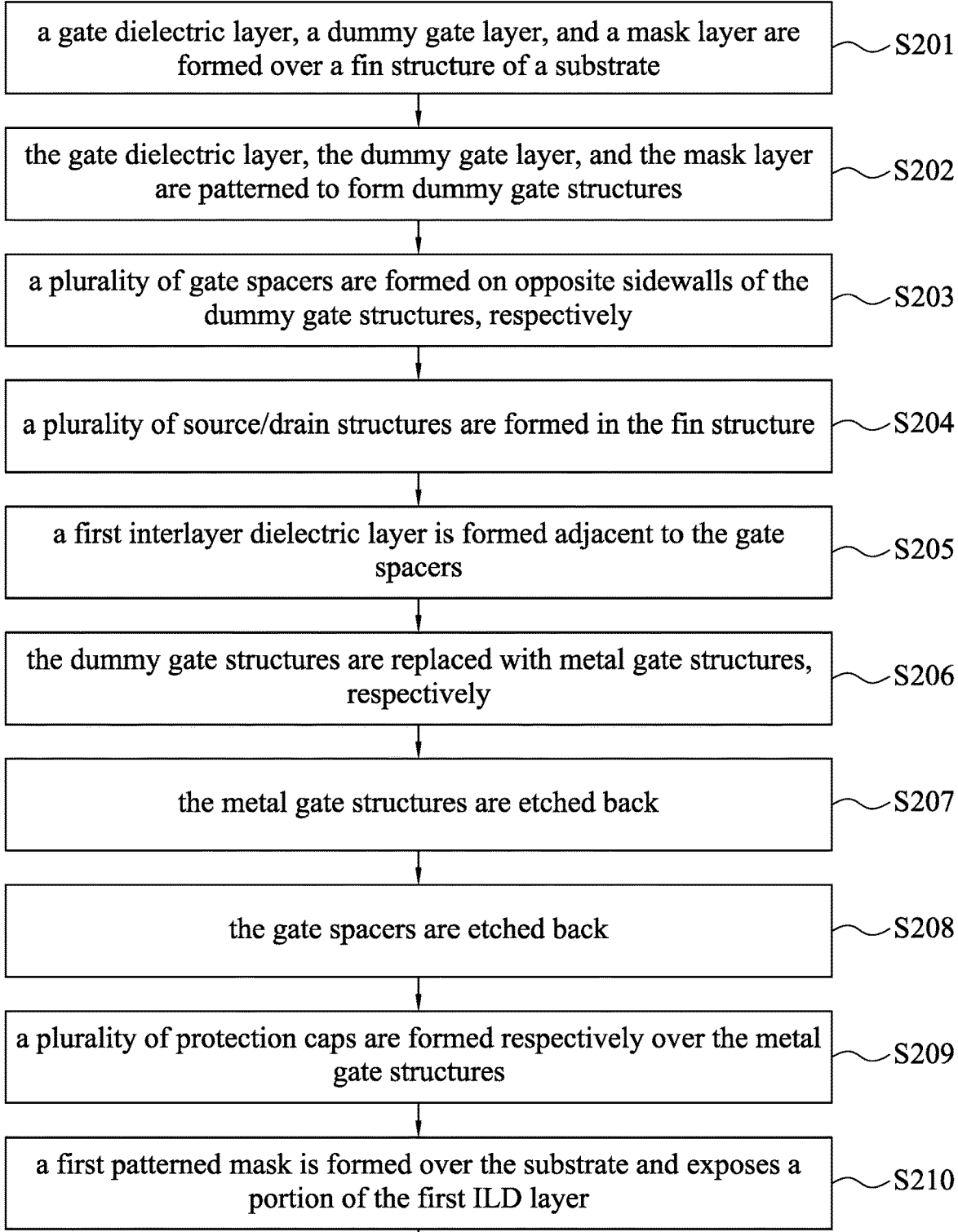
FIGS. 27A and 27B illustrate a method of forming a semiconductor device in accordance with some embodiments of the present disclosure.
Figure 27B:
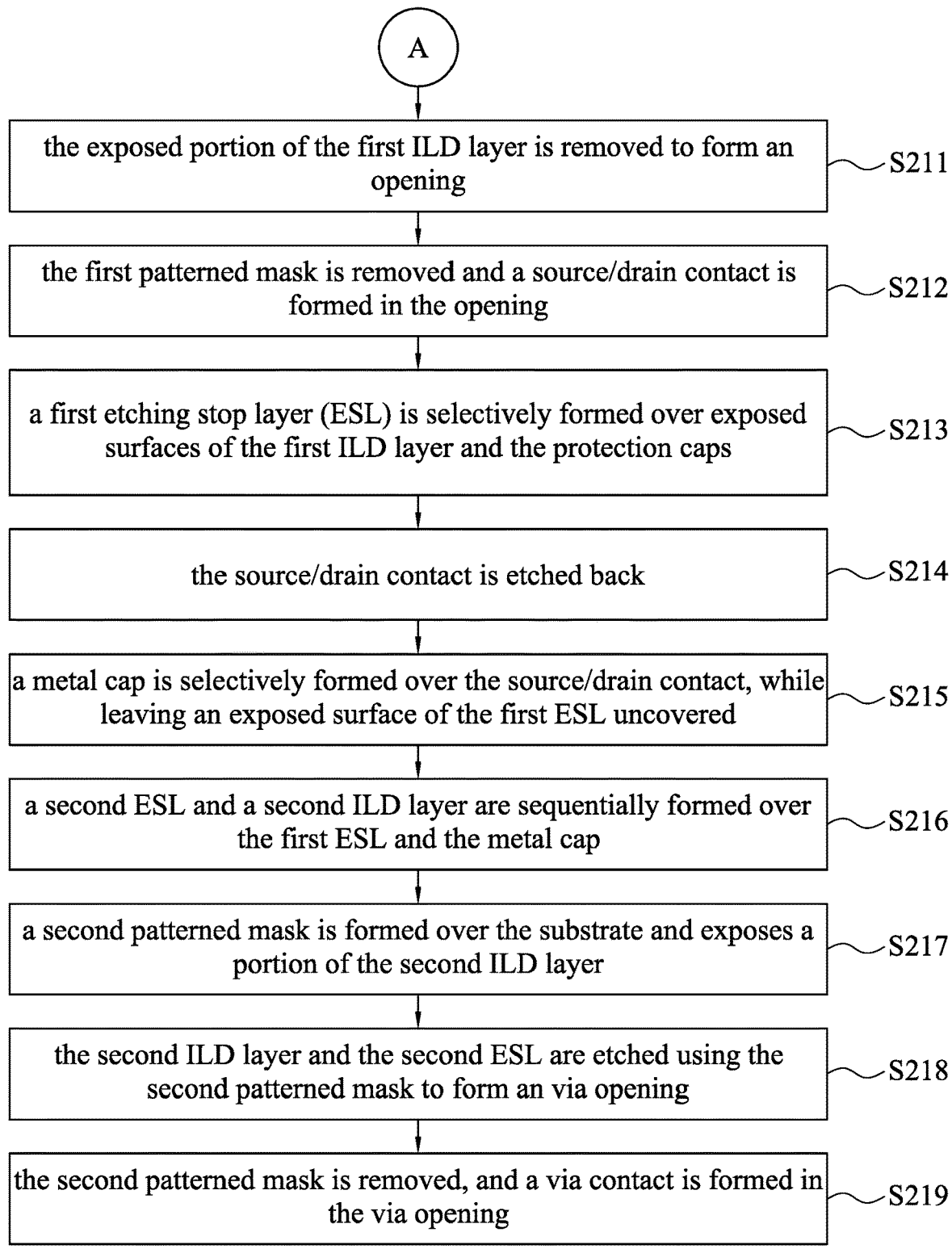

FIGS. 27A and 27B illustrate a method M2 of forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. Blocks 201 to 213 are similar to blocks 101 to 103 of method M1 in FIGS. 20A and 20B, and thus details in this regard are omitted for simplicity.

At block S214, the source/drain contact is etched back. FIG. 21 illustrates a cross-sectional view of some embodiments corresponding to act in block S214.

At block S215, a metal cap is selectively formed over the source/drain contact, while leaving an exposed surface of the first ESL uncovered. FIG. 22 illustrates a cross-sectional view of some embodiments corresponding to act in block S215.

At block S216, a second ESL and a second ILD layer are sequentially formed over the first ESL and the metal cap. FIG. 23 illustrates a cross-sectional view of some embodiments corresponding to act in block S216.

At block S217, a second patterned mask is formed over the substrate and exposes a portion of the second ILD layer. FIG. 24 illustrates a cross-sectional view of some embodiments corresponding to act in block S217.

At block S218, the second ILD layer and the second ESL are etched using the second patterned mask to form an via opening. FIG. 25 illustrates a cross-sectional view of some embodiments corresponding to act in block S218.

At block S219, the second patterned mask is removed, and a via contact is formed in the via opening. FIG. 26 illustrates a cross-sectional view of some embodiments corresponding to act in block S219.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that a first etching stop layer is selectively formed over a protection cap over a metal gate, while leaving a top surface of a source/drain contact uncovered. The first etching stop layer can act as a protective layer to prevent the protection cap from being etched. Further, due to the selective deposition manner, a second etching stop layer can be formed in contact with the source/drain contact, such that an via opening can be formed self-aligned with the source/drain contact after removing the second etching stop layer, which in turn can skip an additional etching process used to remove the first etching stop layer. Another advantage is that a metal cap is selectively formed on the source/drain contact, the source/drain contact can be protected by the metal cap from being etched during forming the via opening, which will improve the quality and performance of the device.

In some embodiments of the present disclosure, a method includes forming a dummy gate structure over a substrate; forming a source/drain structure over the substrate; replacing the dummy gate with a metal gate structure; forming a protection cap over the metal gate structure; forming a source/drain contact over the source/drain structure; performing a selective deposition process to form a first etch stop layer on the substrate, in which the selective deposition process has a faster deposition rate on the protection cap than on the source/drain contact; depositing a second etch stop layer over the first etch stop layer the source/drain contact; etching the second etch stop layer to form an opening; and forming a via contact in the opening.

In some embodiments of the present disclosure, a method includes forming a gate structure over a substrate; forming gate spacers on opposite sidewalls of the gate structure; forming source/drain structures over the substrate and on opposite sides of the gate structure; forming a source/drain contact over one of the source/drain structures; forming a protection cap over the gate structure and the gate spacers; forming a first etch stop layer over the protection cap; after forming the first etch stop layer, etching back the source/drain contact to expose a sidewall of the protection cap; and forming a via contact in contact with the sidewall of the protection cap and a sidewall of the first etch stop layer.

In some embodiments of the present disclosure, forming a gate structure over a substrate; forming gate spacers on opposite sidewalls of the gate structure; forming source/drain structures over the substrate and on opposite sides of the gate structure; forming a source/drain contact over one of the source/drain structures; forming a first etch stop layer over the gate structure; after forming the first etch stop layer, selectively forming a metal cap over the source/drain contact, wherein the metal cap has a higher deposition rate on the source/drain contact than on the first etch stop layer; and forming a via contact over the metal cap and the first etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dummy gate structure over a substrate;
   forming a source/drain structure over the substrate;
   replacing the dummy gate structure with a metal gate structure;
   forming a protection cap over the metal gate structure;
   forming a source/drain contact over the source/drain structure;
   performing a selective deposition process to form a first etch stop layer on the protection cap, wherein the selective deposition process has a faster deposition rate on the protection cap than on the source/drain contact;
   depositing a second etch stop layer over the first etch stop layer and the source/drain contact;
   forming an interlayer dielectric (ILD) layer over the second etch stop layer;
   etching the ILD layer and the second etch stop layer to form an opening; and
   forming a via contact in the opening.

2. The method of claim 1, further comprising depositing a metal cap on a top surface of the source/drain contact prior to depositing the second etch stop layer, while keeping a top surface of the first etch stop layer uncovered.

3. The method of claim 1, further comprising etching back the source/drain contact after depositing the first etch stop layer selectively on the protection cap.

4. The method of claim 1, wherein depositing the second etch stop layer is performed using a non-selective deposition process.

5. The method of claim 1, wherein the selective deposition process is performed such that a top surface of the source/drain contact is free from the first etch stop layer.

6. A method, comprising:
   forming a gate structure over a substrate;
   forming gate spacers on opposite sidewalls of the gate structure;
   forming source/drain structures over the substrate and on opposite sides of the gate structure;
   forming a source/drain contact over one of the source/drain structures;
   forming a protection cap over the gate structure and the gate spacers;
   forming a first etch stop layer over the protection cap;
   after forming the first etch stop layer, etching back the source/drain contact to expose a sidewall of the protection cap; and
   forming a via contact in contact with the sidewall of the protection cap and a sidewall of the first etch stop layer.

7. The method of claim 6, wherein forming the first etch stop layer comprises performing a selective deposition process, such that a top surface of the source/drain contact is free from the first etch stop layer.

8. The method of claim 6, further comprising forming a second etch stop layer in contact with the first etch stop layer using a non-selective deposition process.

9. The method of claim 6, further comprising:
prior to forming the via contact, forming a second etch stop layer over the first etch stop layer and covering the sidewall of the protection cap;
forming an interlayer dielectric (ILD) layer over the second etch stop layer; and
performing an etching process to remove portions of the second etch stop layer and the ILD layer to expose the sidewall of the protection cap.

10. The method of claim 9, wherein the etching process is performed such that a portion of the first etch stop layer is thinned.

11. The method of claim 9, wherein forming the second etch stop layer is performed such that a bottommost surface of the second etch stop layer is lower than a bottommost surface of the first etch stop layer.

12. The method of claim 6, further comprising etching back the gate structure prior to forming the protection cap.

13. The method of claim 6, further comprising etching back the gate spacers after etching back the gate structure and prior to forming the protection cap.

14. A method, comprising:
forming a gate structure over a substrate;
forming gate spacers on opposite sidewalls of the gate structure;
forming source/drain structures over the substrate and on opposite sides of the gate structure;
forming a source/drain contact over one of the source/drain structures;
forming a first etch stop layer over the gate structure;
after forming the first etch stop layer, selectively forming a metal cap over the source/drain contact, wherein the metal cap has a higher deposition rate on the source/drain contact than on the first etch stop layer; and
forming a via contact over the metal cap and the first etch stop layer.

15. The method of claim 14, further comprising:
forming a second etch stop layer over the first etch stop layer;
forming an interlayer dielectric (ILD) layer over the second etch stop layer; and
etching the second etch stop layer and the ILD layer to form an opening, wherein the via contact is formed in the opening.

16. The method of claim 15, wherein etching the second etch stop layer and the ILD layer further comprises etching the first etch stop layer such that the metal cap protrudes from a top surface of the first etch stop layer.

17. The method of claim 16, wherein the via contact is formed in contact with a sidewall of the metal cap.

18. The method of claim 14, further comprising etching back the source/drain contact such that a top surface of the source/drain contact is lower than top surfaces of the gate spacers.

19. The method of claim 14, further comprising forming a protection cap over the gate structure prior to forming the first etch stop layer, wherein the forming the first etch stop layer comprises performing a selective deposition process, such that a top surface of the source/drain contact is free from the first etch stop layer.

20. The method of claim 1, wherein etching the ILD layer and the second etch stop layer is performed such that a portion of the first etch stop layer is etched.

* * * * *